(12) United States Patent
Sandhu et al.

(10) Patent No.: US 10,777,562 B1
(45) Date of Patent: Sep. 15, 2020

(54) INTEGRATED CIRCUITY, DRAM CIRCUITRY, METHODS USED IN FORMING INTEGRATED CIRCUITRY, AND METHODS USED IN FORMING DRAM CIRCUITRY

(71) Applicant: Micron Technology, Inc., Boise, ID (US)

(72) Inventors: Gurtej S. Sandhu, Boise, ID (US); John A. Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/353,343

(22) Filed: Mar. 14, 2019

(51) Int. Cl.
*H01L 27/24* (2006.01)
*H01L 27/108* (2006.01)

(52) U.S. Cl.
CPC .. *H01L 27/10885* (2013.01); *H01L 27/10814* (2013.01); *H01L 27/10823* (2013.01); *H01L 27/10855* (2013.01); *H01L 27/10876* (2013.01)

(58) Field of Classification Search
CPC combination set(s) only.
See application file for complete search history.

(56) References Cited

U.S. PATENT DOCUMENTS

| | | |
|---|---|---|
| 6,455,370 B1 | 9/2002 | Lane |
| 6,472,322 B2 | 10/2002 | Juengling |
| 6,475,911 B1 | 11/2002 | Lane |
| 6,881,642 B2 | 4/2005 | Basceri et al. |
| 7,445,996 B2 | 11/2008 | McDaniel |
| 7,935,977 B2 | 5/2011 | Lee et al. |
| 2004/0102039 A1 | 5/2004 | Lim et al. |
| 2006/0234492 A1 | 10/2006 | Derderian |
| 2008/0247214 A1* | 10/2008 | Ufert ............... G11C 13/0007 365/148 |
| 2017/0330882 A1 | 11/2017 | Wang et al. |
| 2019/0181338 A1* | 6/2019 | Hashemi ............ H01L 45/146 |

\* cited by examiner

*Primary Examiner* — Thomas L Dickey
(74) *Attorney, Agent, or Firm* — Wells St. John P.S.

(57) ABSTRACT

A method used in forming integrated circuitry comprises forming a plurality of conductive vias comprising conductive material. The conductive vias are spaced relative one another by intermediate material. A discontinuous material is formed atop the conductive material of the vias and atop the intermediate material that is between the vias. Metal material is formed atop, directly against, and between the discontinuous material and atop and directly against the conductive material of the vias. The metal material is of different composition from that of the discontinuous material and is above the intermediate material that is between the vias. The metal material with discontinuous material there-below is formed to comprise a conductive line that is atop the intermediate material that is between the vias and is directly against individual of the vias. Structures independent of method are disclosed.

37 Claims, 32 Drawing Sheets

INTEGRATED CIRCUITRY, DRAM CIRCUITRY, METHODS USED IN FORMING INTEGRATED CIRCUITRY, AND METHODS USED IN FORMING DRAM CIRCUITRY

TECHNICAL FIELD

Embodiments disclosed herein pertain to integrated circuitry, to DRAM circuitry, to methods used in forming integrated circuitry, and to methods used in forming DRAM circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Capacitors and transistors may of course be used in integrated circuitry other than memory circuitry. Regardless, conductive interconnect lines are used to connect various components of integrated circuitry.

DETAILED DESCRIPTION OF EXAMPLE EMBODIMENTS

Embodiments of the invention encompass integrated circuitry constructions, such as DRAM constructions, and methods used in forming an integrated circuitry construction, such as a DRAM circuitry construction. First example embodiments comprising a DRAM construction are described with reference to FIGS. 1-8 showing an example fragment of a substrate construction 8 comprising an array or array area 10 that has been fabricated relative to a base substrate 11. Substrate construction 11 may comprise any one or more of conductive/conductor/conducting, semiconductive/semiconductor/semiconducting, and insulative/insulator/insulating (i.e., electrically herein) materials. Various materials are above base substrate 11. Materials may be aside, elevationally inward, or elevationally outward of the FIGS. 1-8—depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Figure 1:
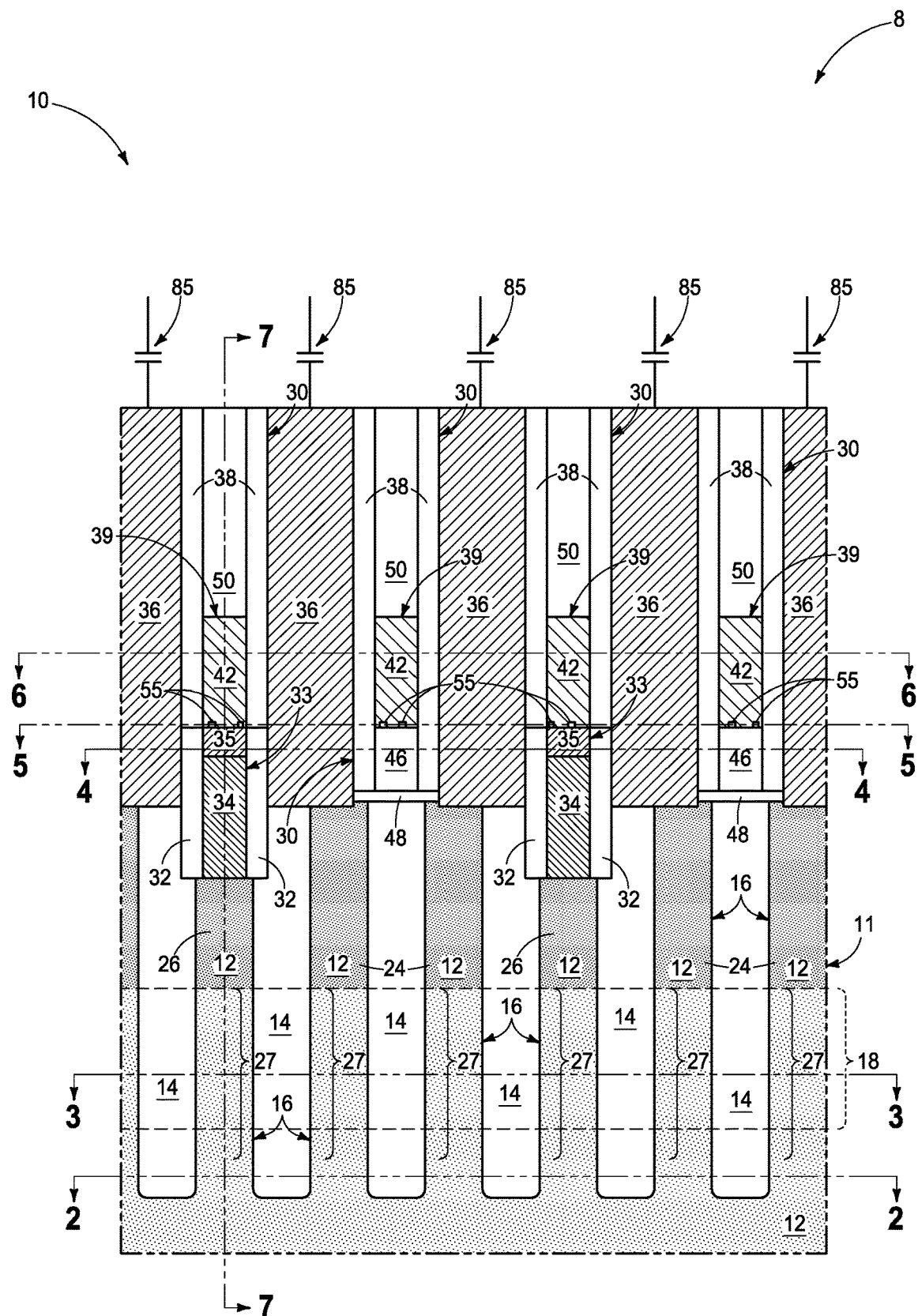
FIG. 1 is a diagrammatic cross-sectional view of a portion of a DRAM construction in accordance with some embodiments of the invention and is taken through line 1-1 in FIGS. 2-8.
Figure 2:
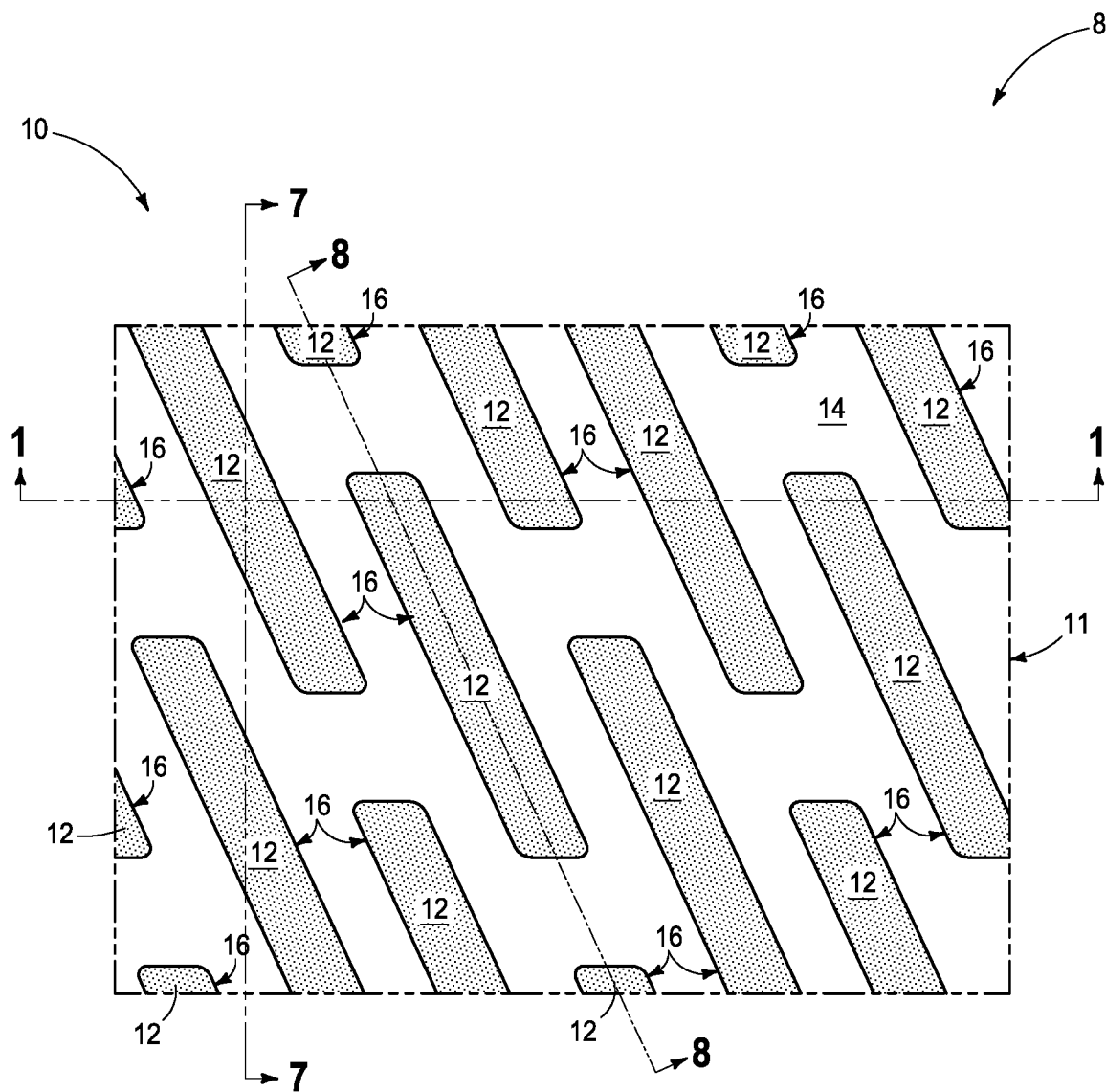
FIG. 2 is a view taken through line 2-2 in FIGS. 1, 7, and 8.
Figure 3:
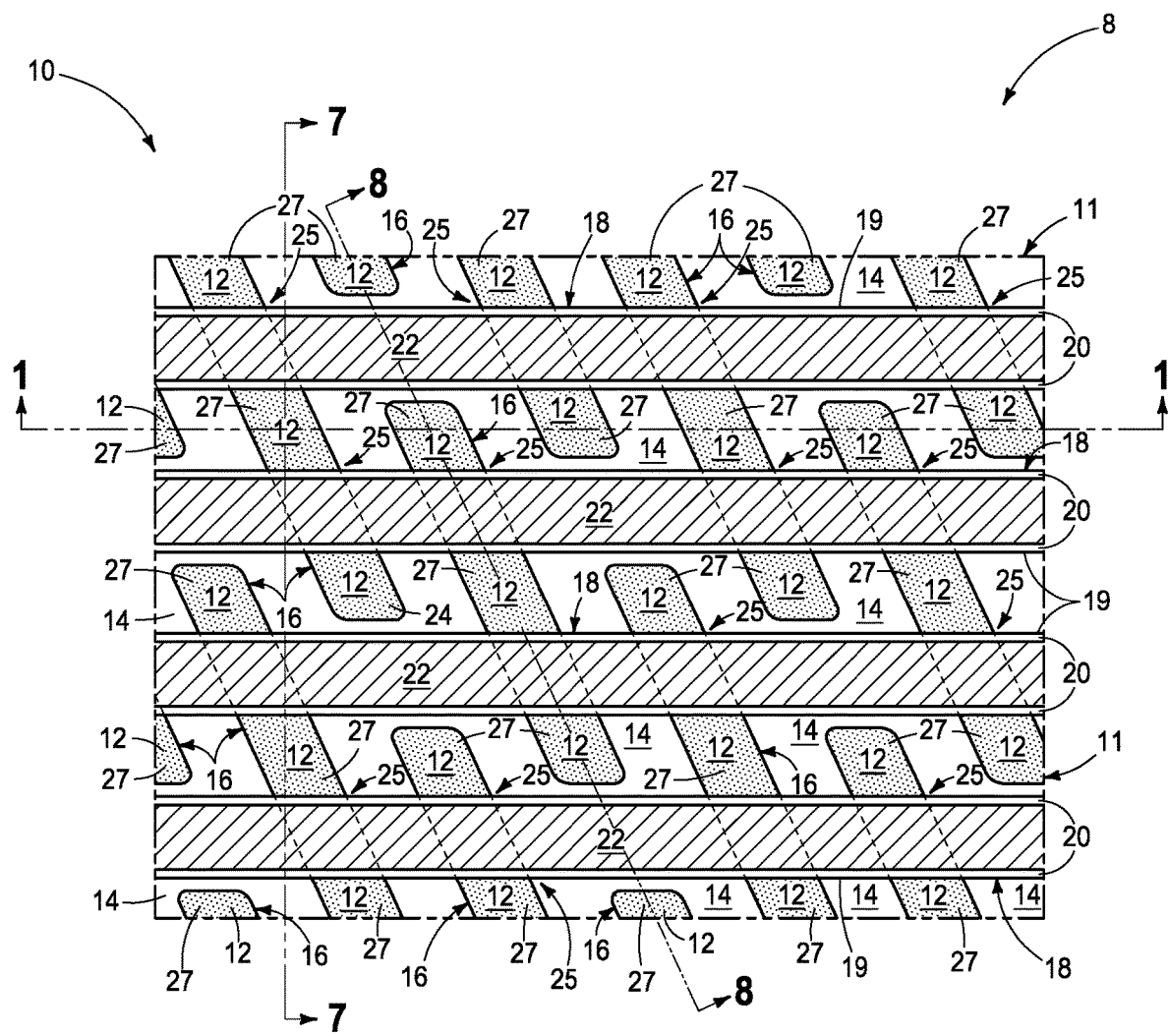
FIG. 3 is a view taken through line 3-3 in FIGS. 1, 7, and 8.
Figure 4:
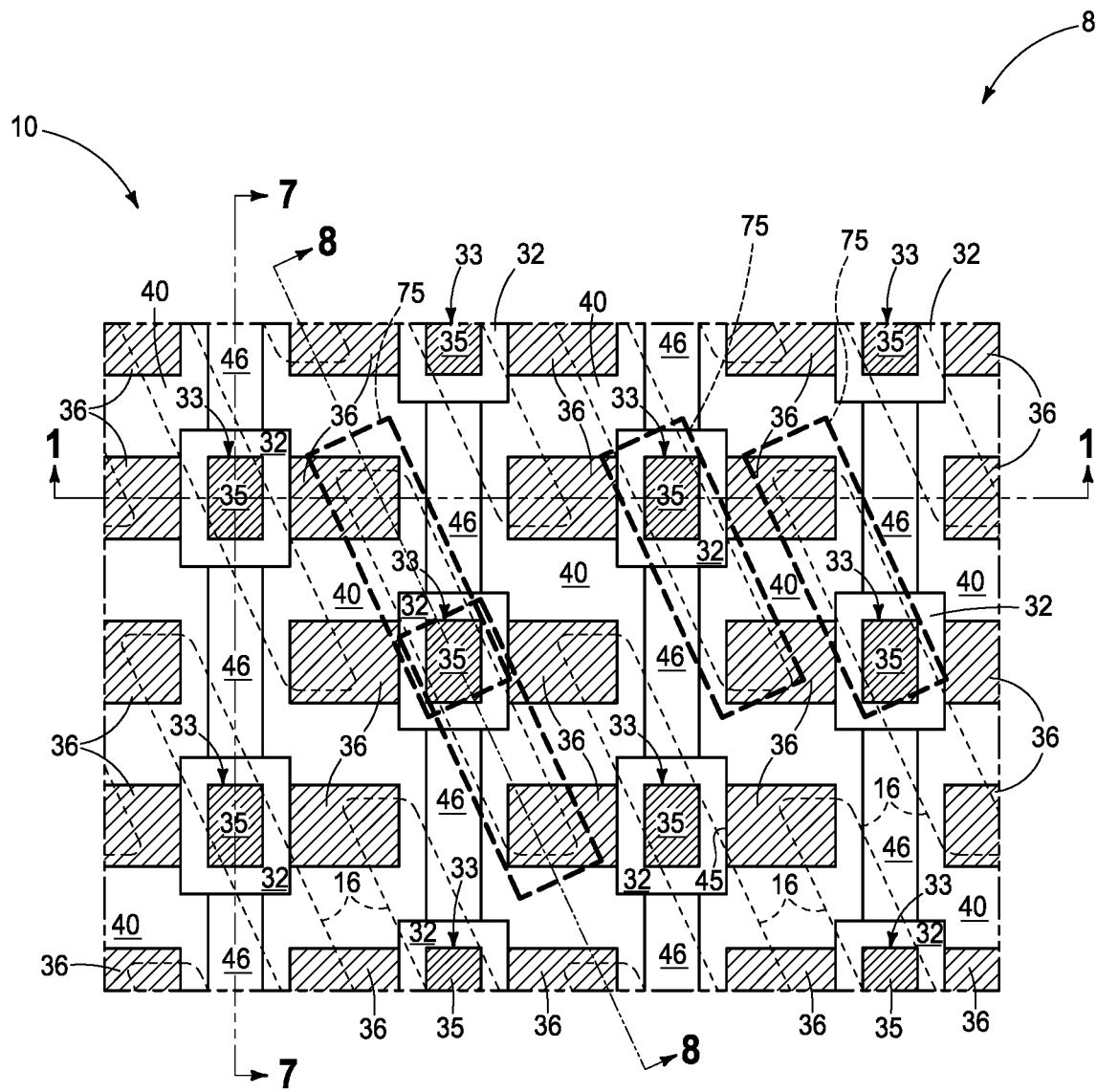
FIG. 4 is a view taken through line 4-4 in FIGS. 1, 7, and 8.
Figure 5:
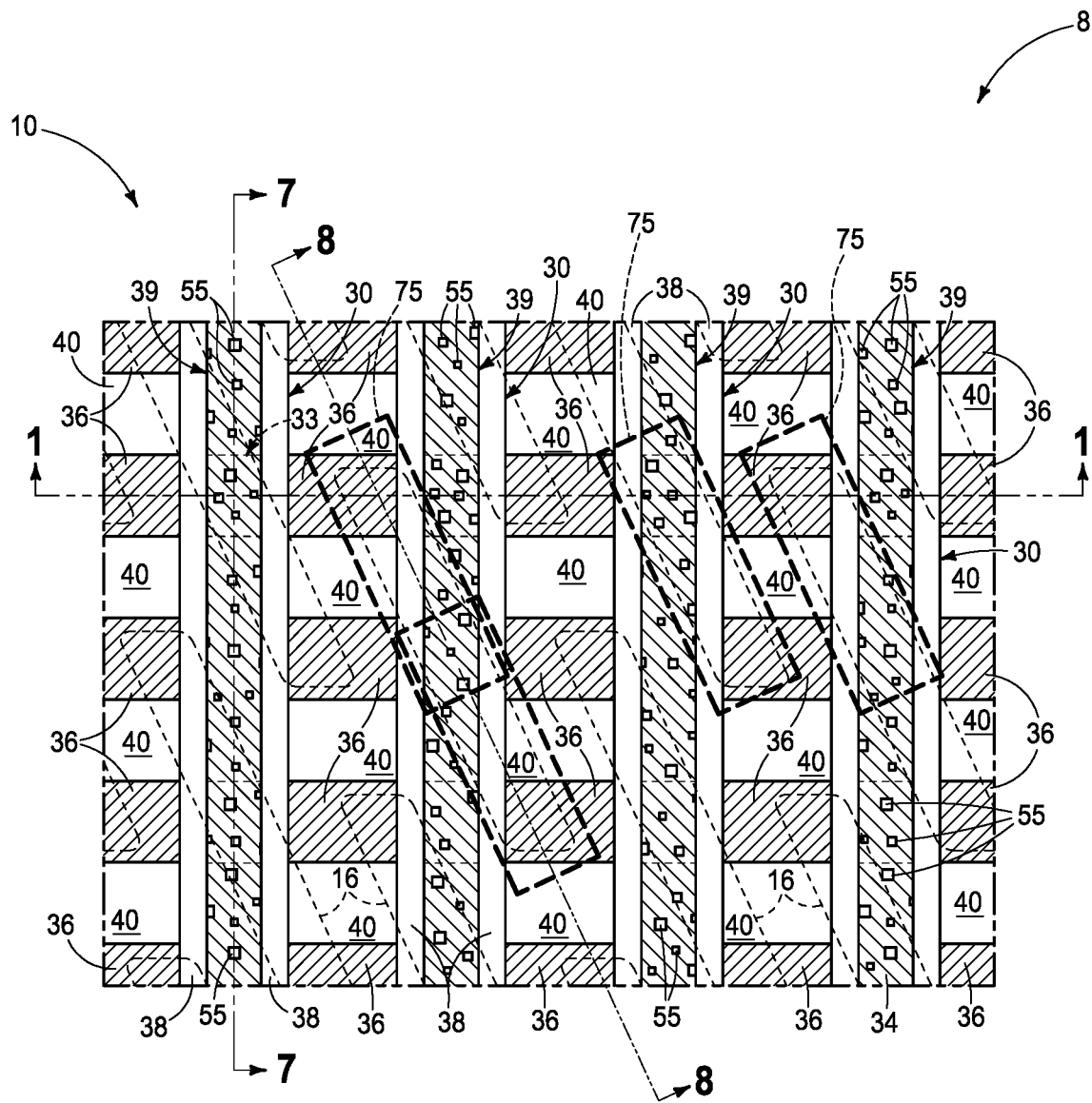
FIG. 5 is a view taken through line 5-5 in FIGS. 1, 7, and 8.
Figure 6:
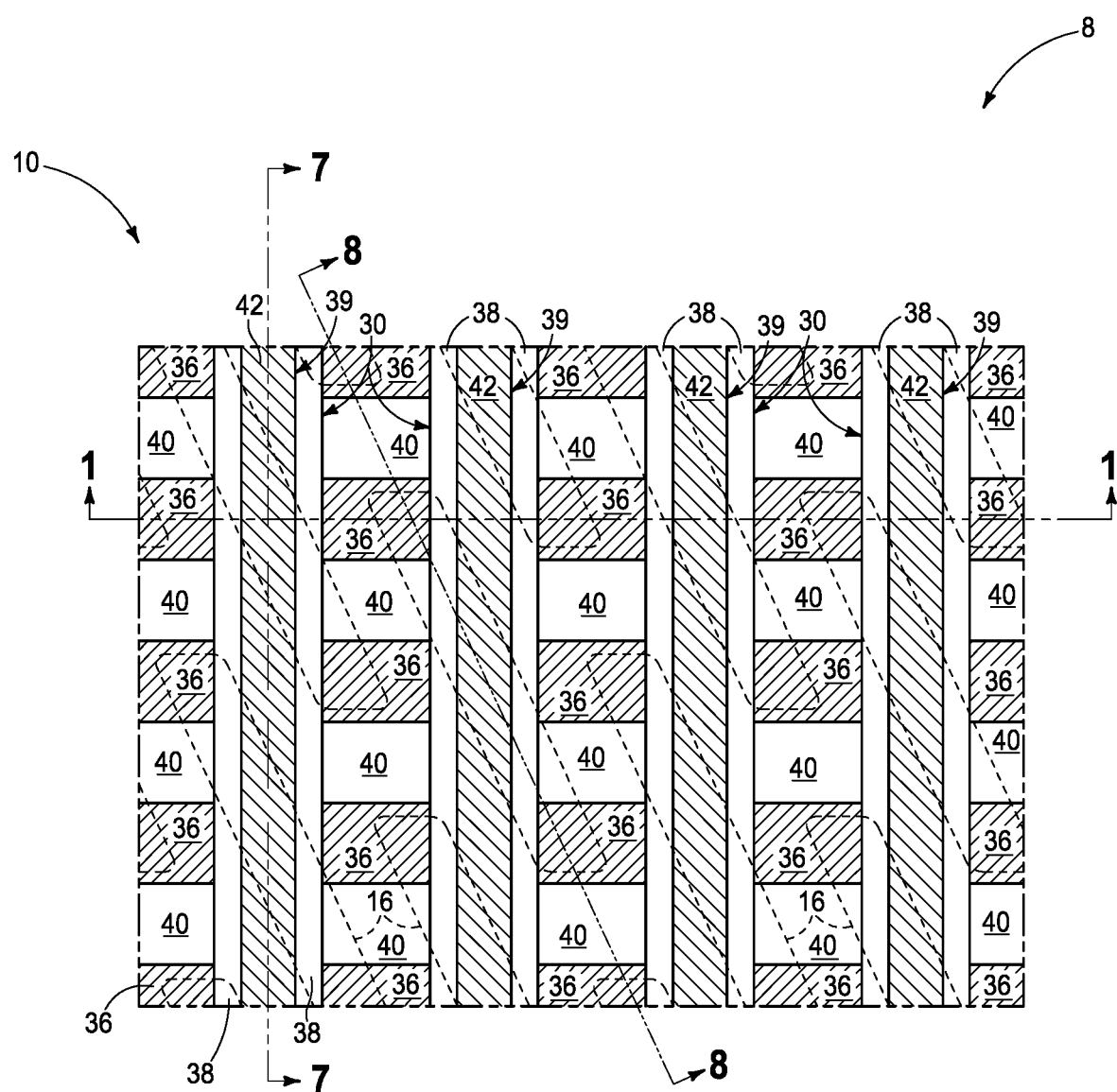
FIG. 6 is a view taken through line 6-6 in FIGS. 1, 7, and 8.
Figure 7:
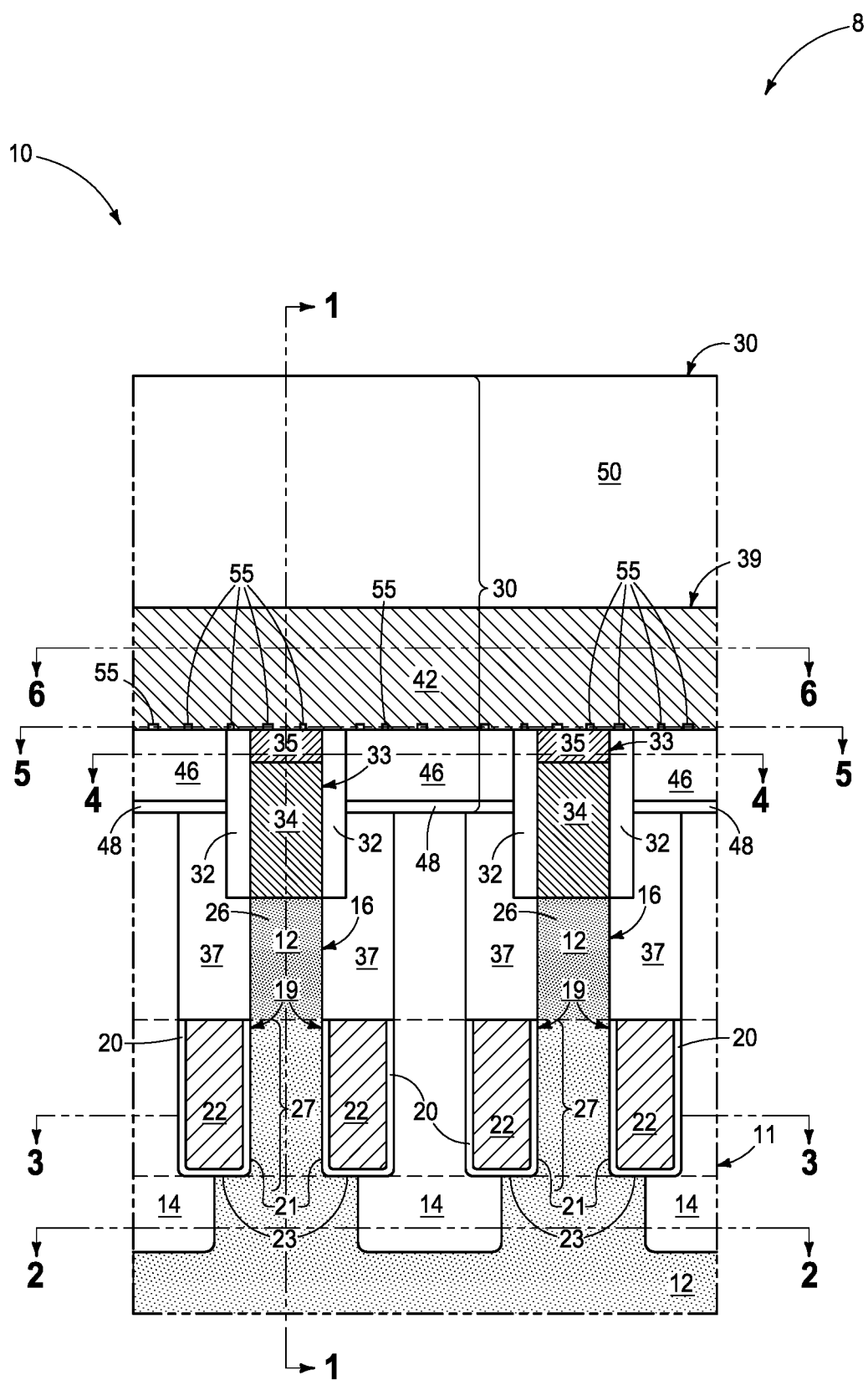
FIG. 7 is a view taken through line 7-7 in FIGS. 1-6.
Figure 8:
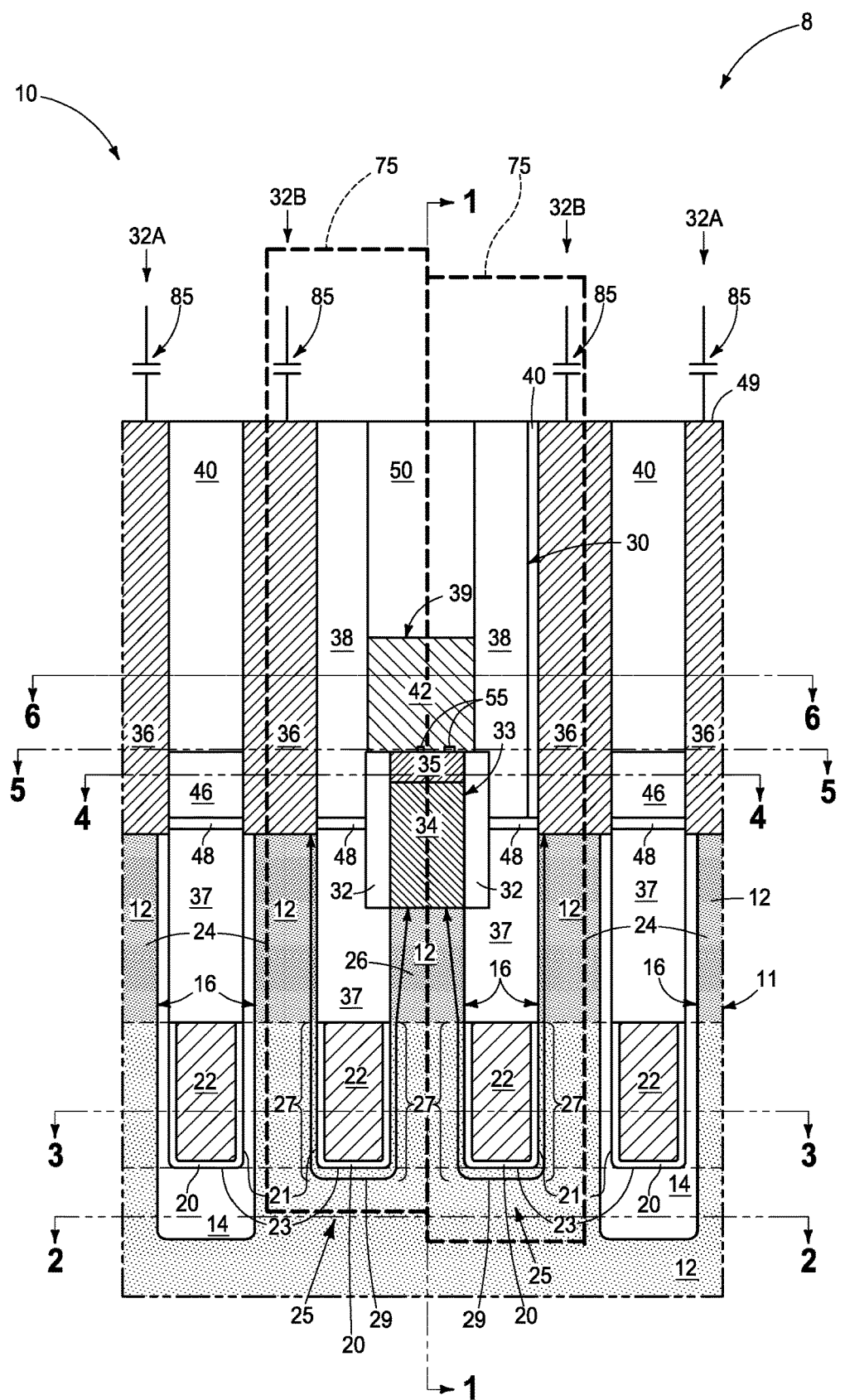
FIG. 8 is a view taken through line 8-8 in FIGS. 2-6.

Base substrate 11 comprises semiconductive material 12 (e.g., appropriately and variously doped monocrystalline and/or polycrystalline silicon, Ge, SiGe, GaAs, and/or other existing or future-developed semiconductive material), trench isolation regions 14 (e.g., silicon nitride and/or silicon dioxide), and active area regions 16 comprising suitably and variously-doped semiconductive material 12. In one embodiment, construction 8 comprises memory cells 75 (FIGS. 4, 5, and 8, and with only four outlines 75 shown in FIGS. 4 and 5 and only two outlines 75 in FIG. 8 for clarity in such figures), for example DRAM memory cells individually comprising a field effect transistor device 25 (FIG. 3) and a storage element (e.g., a capacitor 85; FIGS. 1 and 8). However, embodiments of the invention encompass other memory cells and other constructions of integrated circuitry independent of whether containing memory cells.

Example transistor devices 25 individually comprise a pair of source/drain regions, a channel region between the pair of source/drain regions, a conductive gate operatively proximate the channel region, and a gate insulator between the conductive gate and the channel region. Devices 25 are shown as being recessed access devices, with example construction 8 showing such recessed access devices grouped in individual pairs of such devices. Individual recessed access devices 25 include a buried access line construction 18, for example that is within a trench 19 in semiconductive material 12. Constructions 18 comprise conductive gate material 22 (e.g., conductively-doped semiconductor material and/or metal material, including for example elemental W, Ru, and/or Mo) that functions as a conductive gate of individual devices 25. A gate insulator 20 (e.g., silicon dioxide and/or silicon nitride) is along sidewalls 21 and a base 23 of individual trenches 19 between conductive gate material 22 and semiconductive material 12. Insulator material 37 (e.g., silicon dioxide and/or silicon nitride) is within trenches 19 above materials 20 and 22. Individual devices 25 comprise a pair of source/drain regions 24, 26 in upper portions of semiconductive material 12 on opposing sides of individual trenches 19 (e.g., regions 24, 26 being laterally outward of and higher than access line constructions 18). Each of source/drain regions 24, 26 has at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/cm$^3$). Accordingly, all or only a part of each source/drain region 24, 26 may have such maximum concentration of conductivity-increasing dopant. Source/drain regions 24 and/or 26 may include other doped regions (not shown), for example halo regions, LDD regions, etc.

One of the source/drain regions (e.g., region 26) of the pair of source/drain regions in individual of the pairs of recessed access devices 25 is laterally between conductive gate material 22 and is shared by the pair of devices 25. Others of the source/drain regions (e.g., regions 24) of the pair of source/drain regions are not shared by the pair of devices 25. Thus, in the example embodiment, each active area region 16 comprises two devices 25 (e.g., one pair of devices 25), with each sharing a central source/drain region 26.

An example channel region 27 (FIGS. 1, 3, 7, and 8) is in semiconductive material 12 below pair of source/drain regions 24, 26 along trench sidewalls 21 (FIGS. 7 and 8) and around trench base 23. Channel region 27 may be undoped or may be suitably doped with a conductivity-increasing dopant likely of the opposite conductivity-type of the dopant in source/drain regions 24, 26, and for example that is at a maximum concentration in the channel of no greater than $1\times10^{17}$ atoms/cm$^3$. When suitable voltage is applied to gate material 22 of an access line construction 18, a conductive channel forms (e.g., along a channel current-flow line/path 29 [FIG. 8]) within channel region 27 proximate gate insulator 20 such that current is capable of flowing between a pair of source/drain regions 24 and 26 under the access line construction 18 within an individual active area region 16. Stippling is diagrammatically shown to indicate primary conductivity-modifying dopant concentration (regardless of type), with denser stippling indicating greater dopant concentration and lighter stippling indicating lower dopant concentration. Conductivity-modifying dopant may be, and would likely be, in other portions of material 12 as shown. Only two different stippling densities are shown in material 12 for convenience, and additional dopant concentrations may be used, and constant dopant concentration is not required in any region.

First conductive/conductor vias 36 are individually directly electrically coupled to one of the source/drain regions (e.g., 24) of the pair of source/drain regions. A storage element (e.g., capacitor 85) is directly electrically coupled to individual first conductive/conductor vias 36.

Second conductive vias 33 are individually directly electrically coupled to the other of the source/drain regions (e.g., 26) of the pairs of source/drain regions. Second vias 33 are spaced relative one another (e.g., longitudinally relative to a digitline 39 there-above as described below) by intermediate material (e.g., one or more of materials 32, 37, 14, 38, 48, and/or 46 when present, with materials 32, 38, 48, and 46 being described below) and comprise conductive material (e.g., 34 and 35). In one embodiment, conductive material 34/35 of second vias 33 comprises lower conductively-doped semiconductive material 34 (e.g., conductively-doped polysilicon) below upper conductive material 35 (e.g., metal material) that is of different composition from that of conductively-doped semiconductive material 34. Additional example conductive materials for materials 34 and 35, and by way of example only, comprise metal nitrides (e.g., TiN, TaN, WN, MoN), metal carbo-nitrides (e.g., TiCN, TaCN, WCN, MoCN), and elemental-form metals (e.g., Ti, Ta, W, Mo, Co, Cu, Ru, Be) including combinations, compounds, and alloys thereof.

A digitline 39 is atop intermediate material 32, 37, 14, 38, 48, 46 that is between second vias 33 and is directly electrically coupled to individual second vias 33 of multiple of transistors 25. Digitline 39 comprises metal material 42 (e.g., elemental W, Ru, and/or Mo) that is directly against conductive material 34/35 of second vias 33. Example digitlines 39 comprise part of digitline structures 30 that comprises opposing longitudinal insulative sides 38 (e.g., silicon dioxide and/or silicon nitride) and an insulative cap 50 (e.g., silicon nitride and/or silicon dioxide). Example material 46 is below digitlines 39 between immediately-longitudinally-adjacent second vias 33. Lower insulative material 48 (e.g., one or more of silicon dioxide, silicon nitride, aluminum dioxide, hafnium oxide, etc.; e.g., thickness of 50 to 200 Angstroms) is below material 46 between immediately-longitudinally-adjacent second vias 33. Material 46 may be insulative, semiconductive (i.e., material that is not sufficiently doped to be conductive), or conductive or be eliminated, with metal material 42 extending inwardly to lower insulative material 48 (not shown).

In one embodiment, an uppermost portion of the intermediate material (e.g., the uppermost portion of one or both of material 32 and 46) comprises insulative material, in one embodiment comprises conductive material, and in one embodiment comprises semiconductive material (i.e., that is not sufficiently doped to be conductive). In one embodiment if conductive, the uppermost portion of the intermediate material comprises conductively-doped semiconductive material. In one embodiment, an uppermost portion of the intermediate material comprises insulative material and conductive material. By ways of example only, example insulative materials include silicon dioxide, silicon nitride, aluminum oxide, high k materials, low k materials, hafnium oxide, zirconium oxide, and insulative metal oxides that comprise a combination of two or more elemental metals. Example conductive materials include conductively-doped polysilicon as an example conductively-doped semiconductive material, and as well metal materials. An example semiconductive material is undoped or lightly-doped polysilicon.

A discontinuous material 55 is vertically between digitline 39 and conductive material 34/35 of second vias 33 and is vertically between digitline 39 and intermediate material 32, 46 that is between second vias 33. Discontinuous material 55 is of different composition from that of metal material 42 of digitline 39. In one embodiment and as shown, discontinuous material 55 comprises void space there-through (i.e., void space that is laterally between and among spaced portions of material 55), with the void space having greater total horizontal area than total horizontal area of the material of discontinuous material 55. In one embodiment, the discontinuous material is insulative, in one embodiment is conductive, in one embodiment is semiconductive, and in one embodiment comprises elemental-form silicon. In one embodiment, discontinuous material 55 comprises elemental-form metal (e.g., Ti, Ta, W, Mo, Co, Cu, Ru, Be), and in one embodiment is of different composition from that of conductive material 34/35.

Any other attribute(s) or aspect(s) as shown and/or described herein with respect to other embodiments may be used.

Embodiments of the invention encompass an integrated circuitry construction (e.g., 8) independent of whether comprising DRAM or other memory circuitry. Such a construction comprises a plurality of conductive vias (e.g., 33) that are spaced relative one another by intermediate material (one of more of materials 32, 37, 14, 38, 48, and/or 46 when present). A conductive line (e.g., 39) is atop the intermediate material that is between the vias and directly electrically couples to individual of the vias. The conductive line comprises metal material (e.g., 42) directly against conductive material (e.g., 34/35) of the vias. A discontinuous material (e.g., 55) is vertically between the conductive line and the conductive material of the vias and is vertically between the conductive line and the intermediate material that is between the vias. The discontinuous material is of different composition from that of the metal material. In one embodiment, the conductive line is part of memory circuitry comprising NAND architecture (e.g., a digitline). Any other attribute(s) or aspect(s) as shown and/or described herein with respect to other embodiments may be used.

Embodiments of the invention encompass methods used in forming an integrated circuitry construction, for example comprising DRAM, other memory, and/or non-memory circuitry. Regardless, method aspects of the invention may use or have any of the attributes as described herein in structure and/or device embodiments. Likewise, the above-described structure embodiments may incorporate any of the attributes described with respect to method embodiment aspects.

Figure 9:
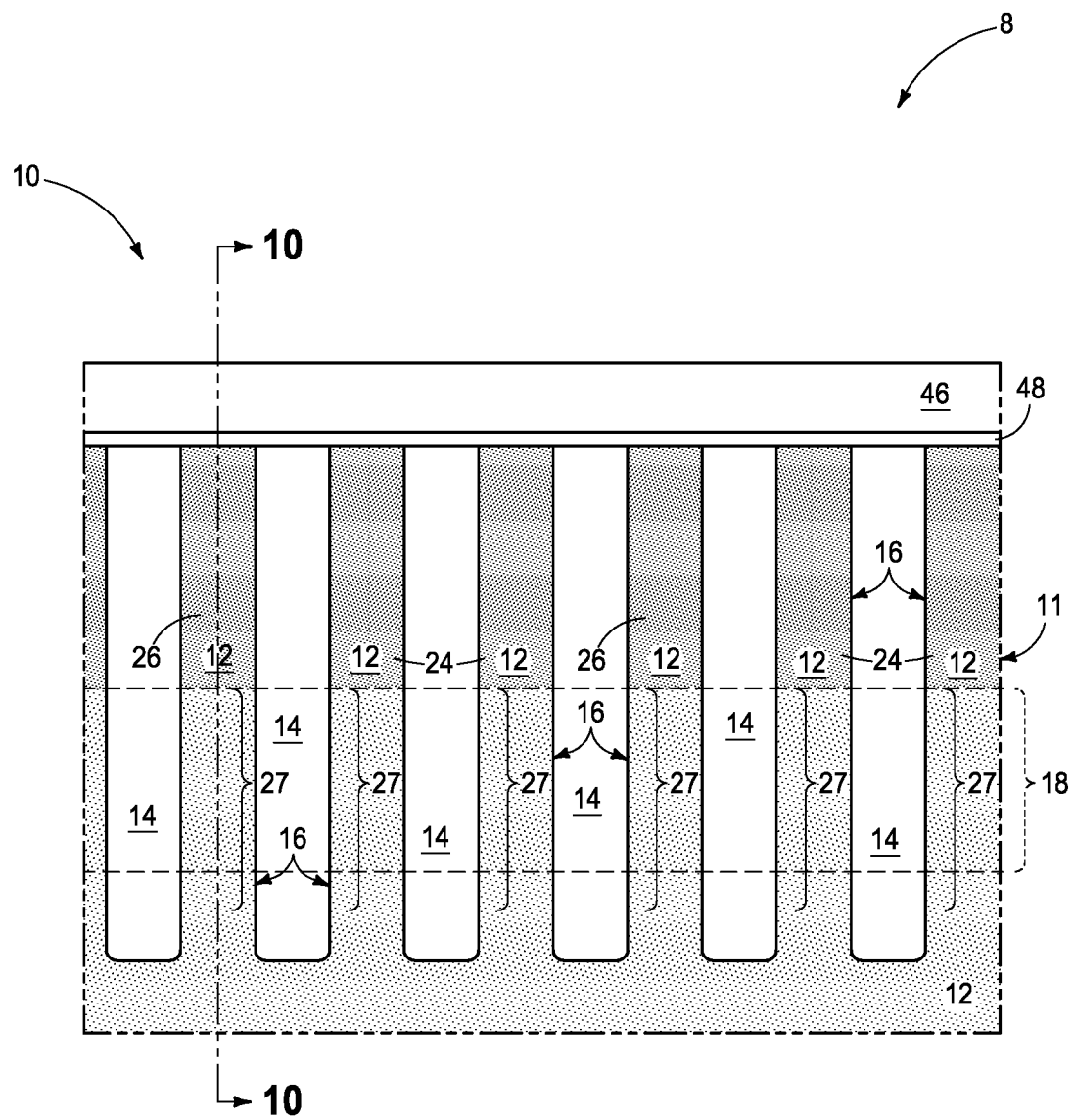
FIGS. 9-29 are diagrammatic sequential sectional views of the predecessor constructions of FIGS. 1-8 in process in accordance with some embodiments of the invention.
Figure 10:
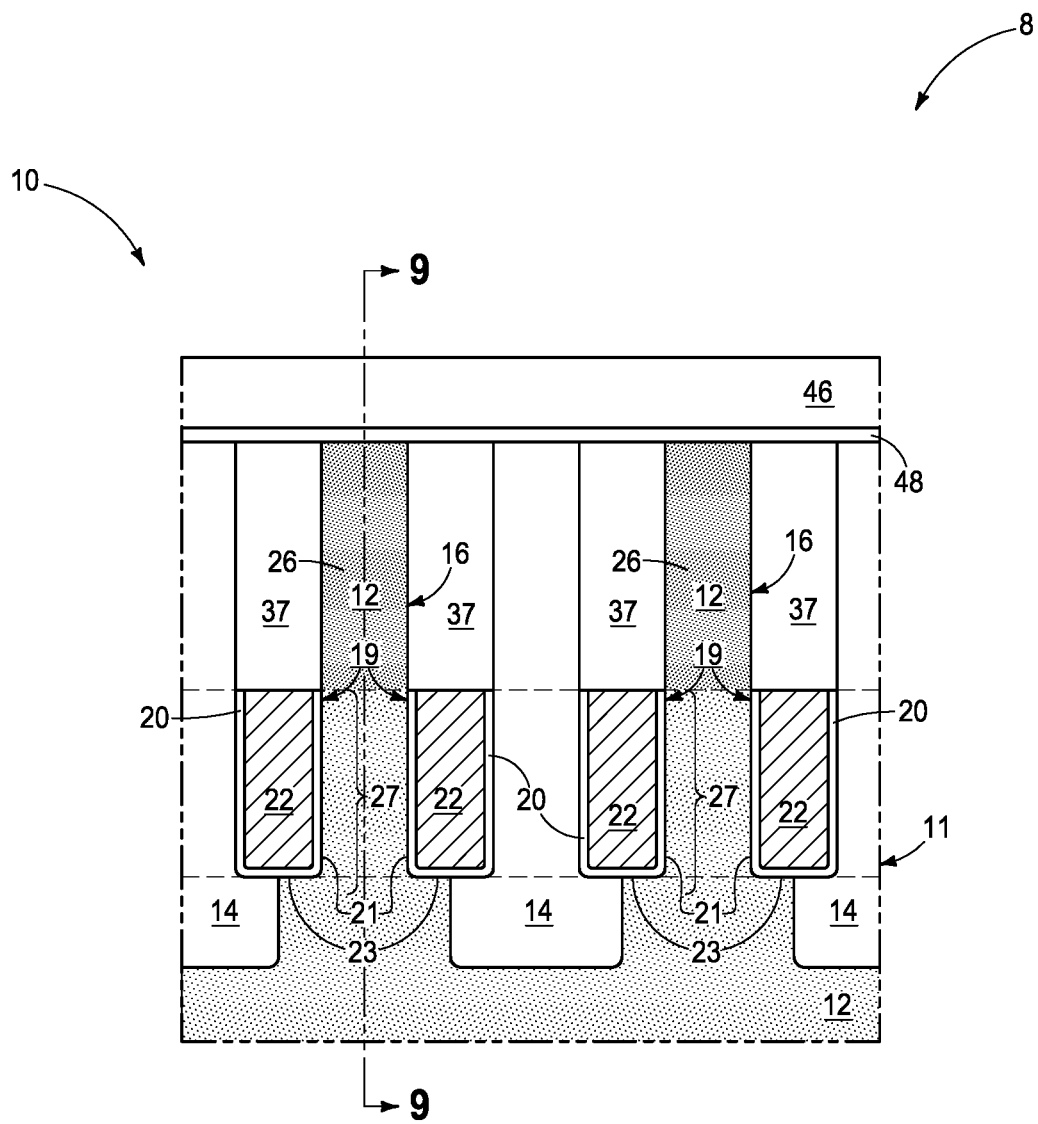
Figure 11:
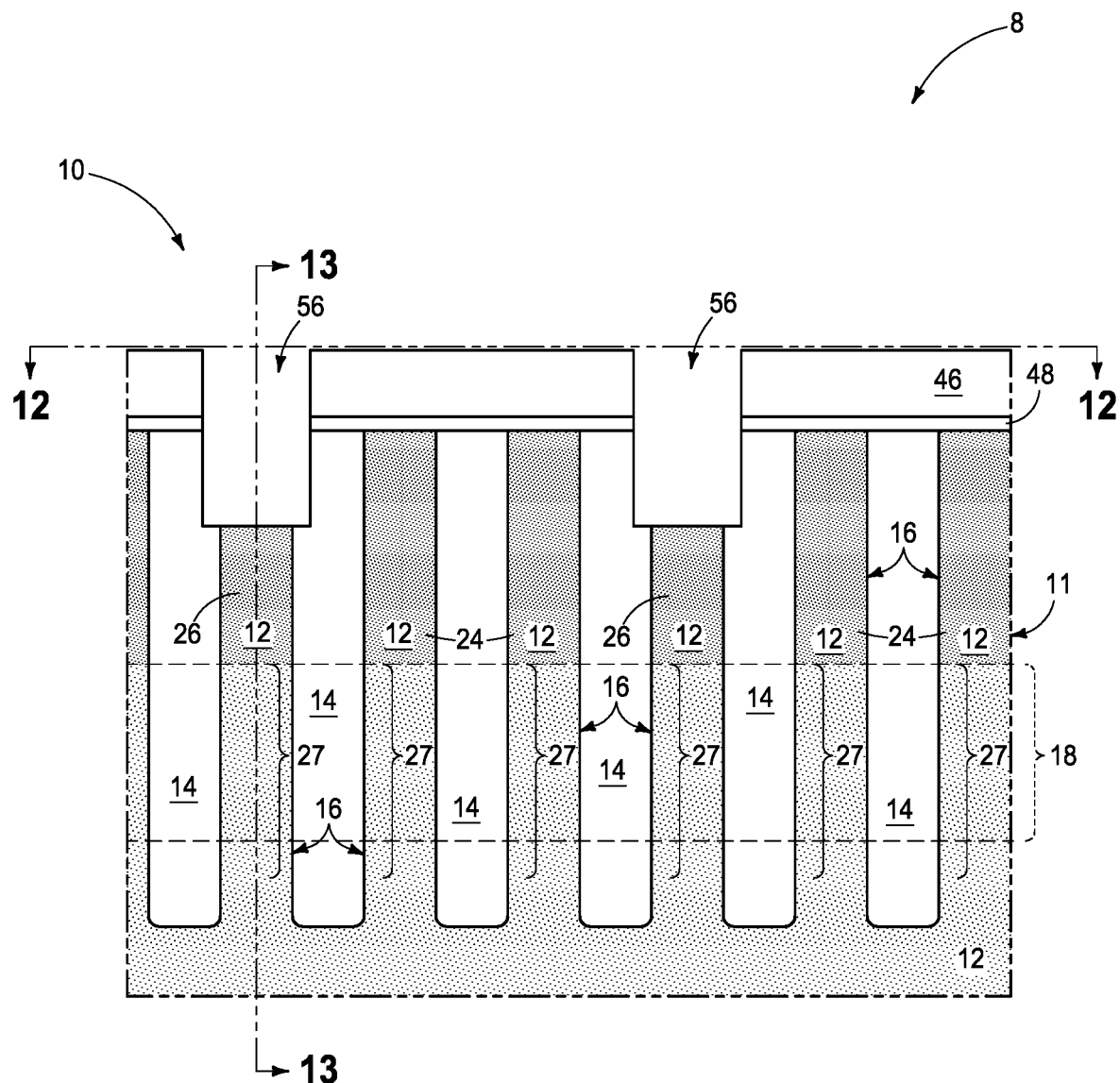
Figure 12:
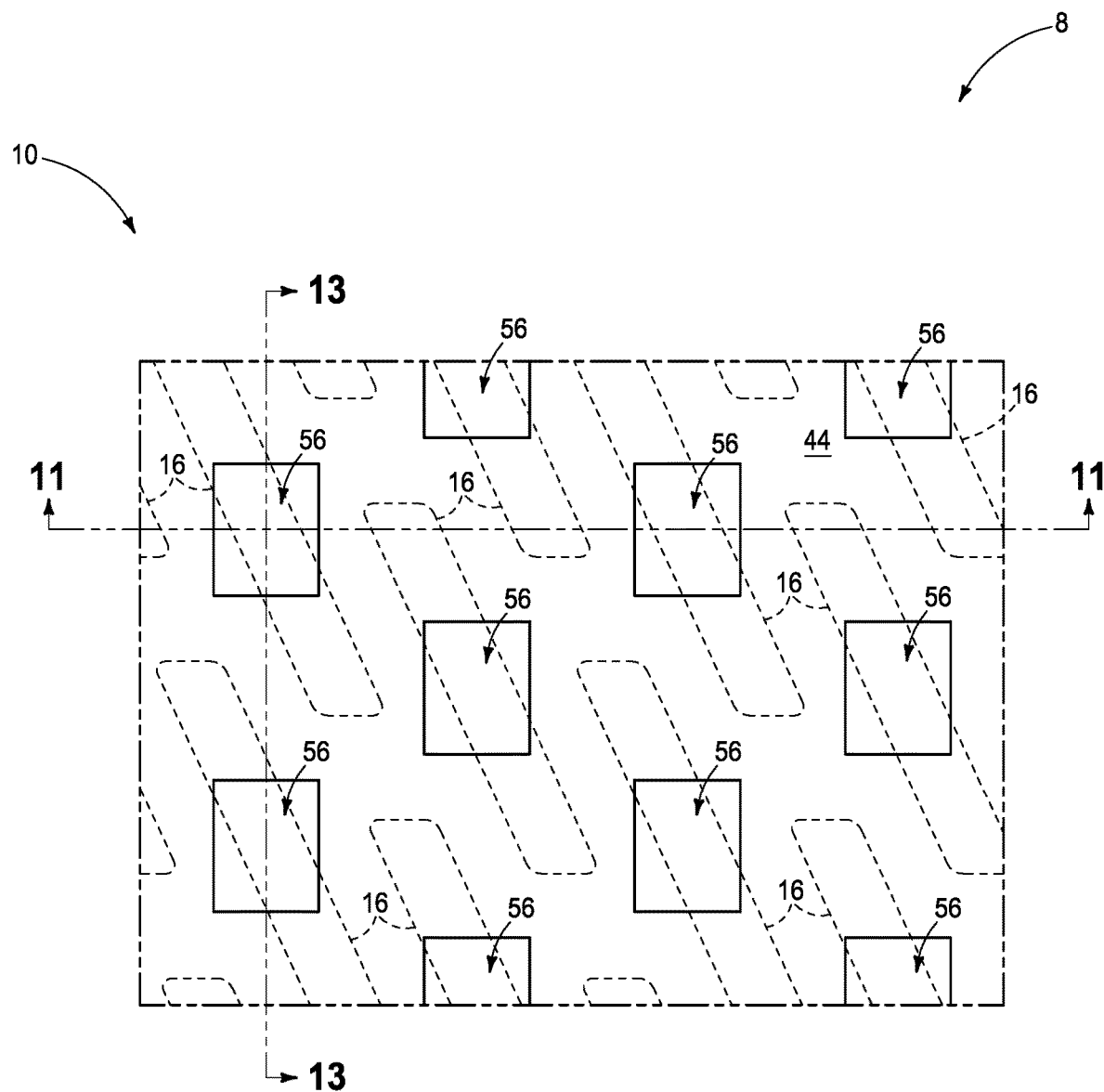
Figure 13:
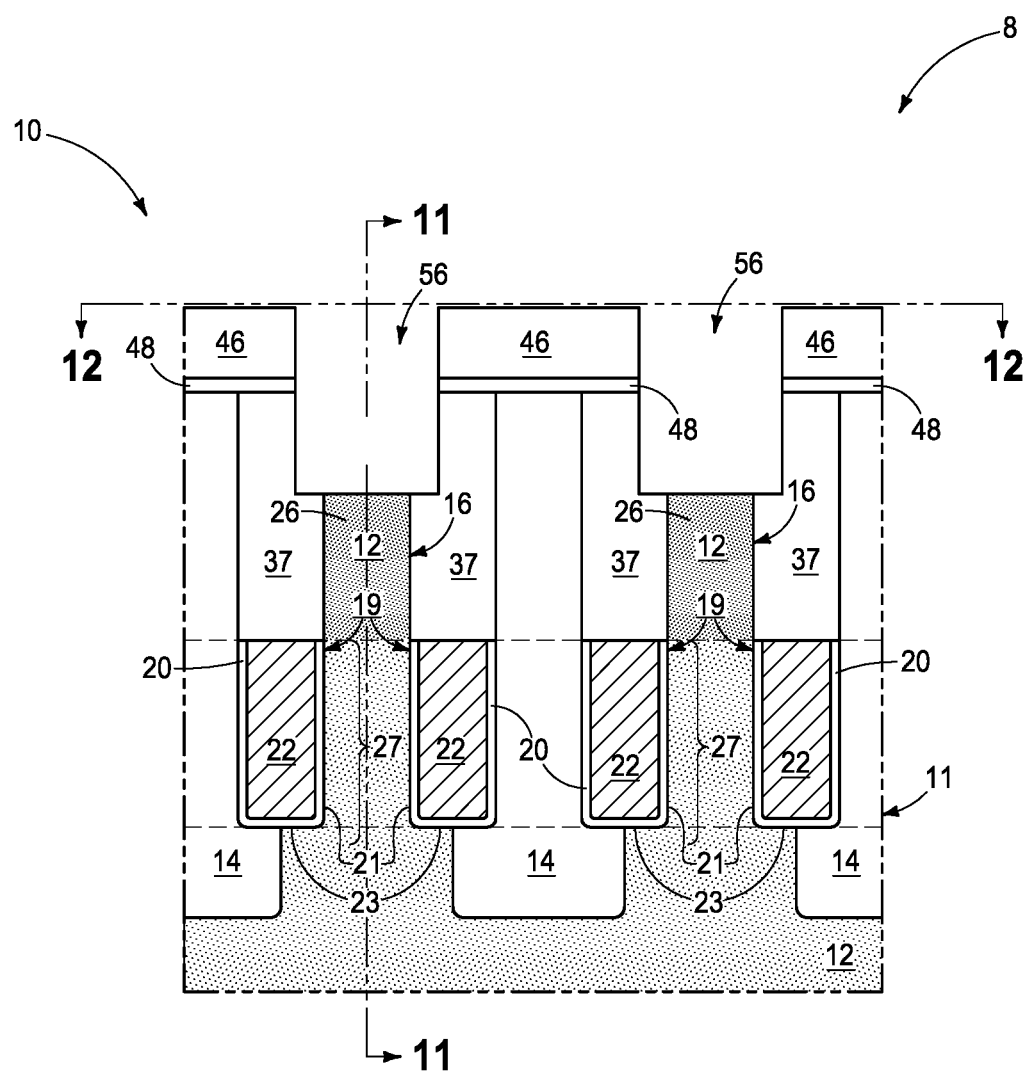

An example method embodiment, and an example such embodiment for producing construction 8 of FIGS. 1-8, is described initially with reference to FIGS. 9-29. Referring to FIGS. 9 and 10, such show a predecessor construction to that of FIGS. 1 and 7 wherein construction 8 has been fabricated to a point of comprising materials 46 and 48 within array 10. FIGS. 11-13 show openings 56 as having been formed there-thorough to source/drain regions 26 and, in one embodiment as shown, to an elevation that is below the bottom of material 48.

Figure 14:
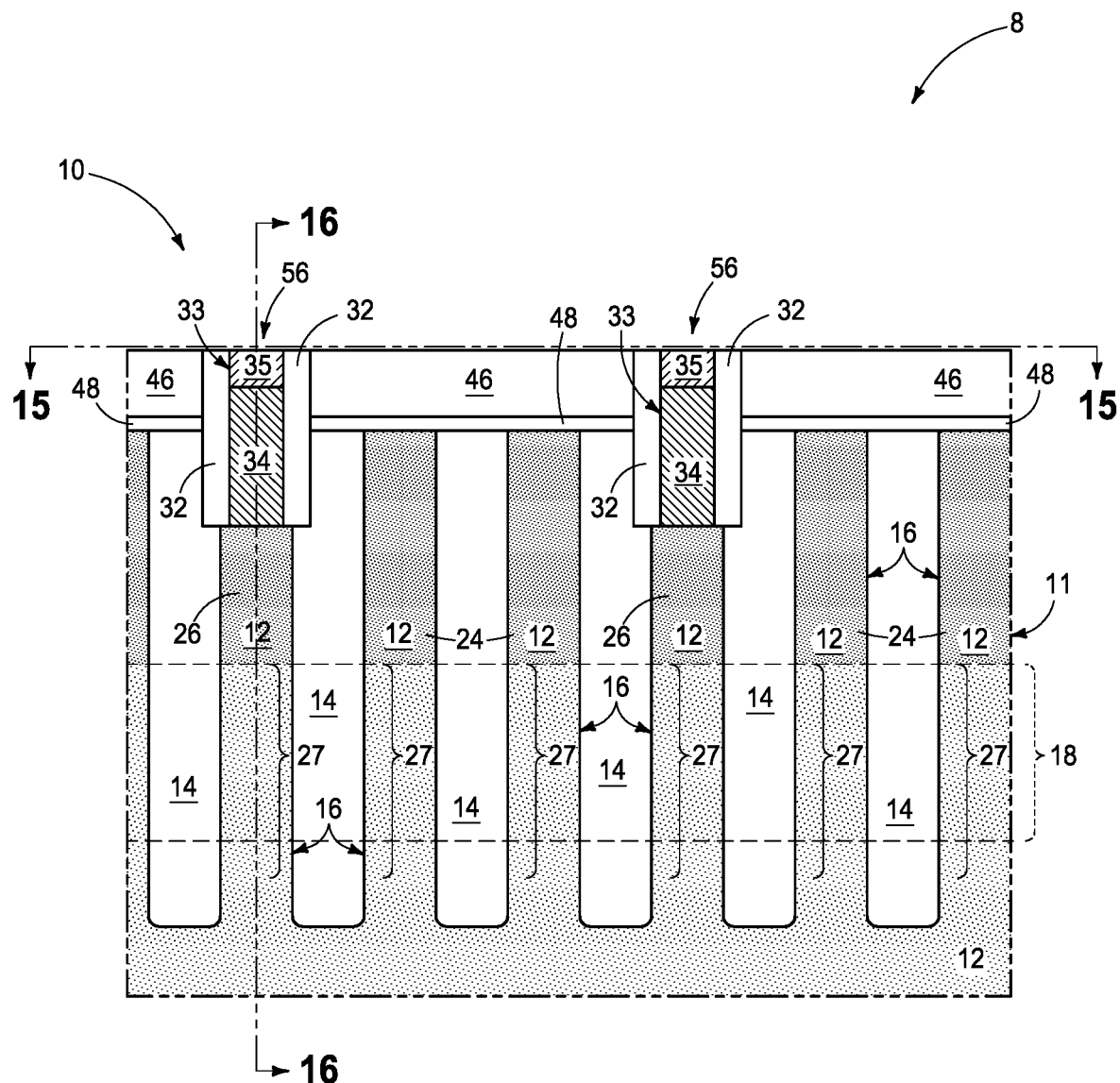
Figure 15:
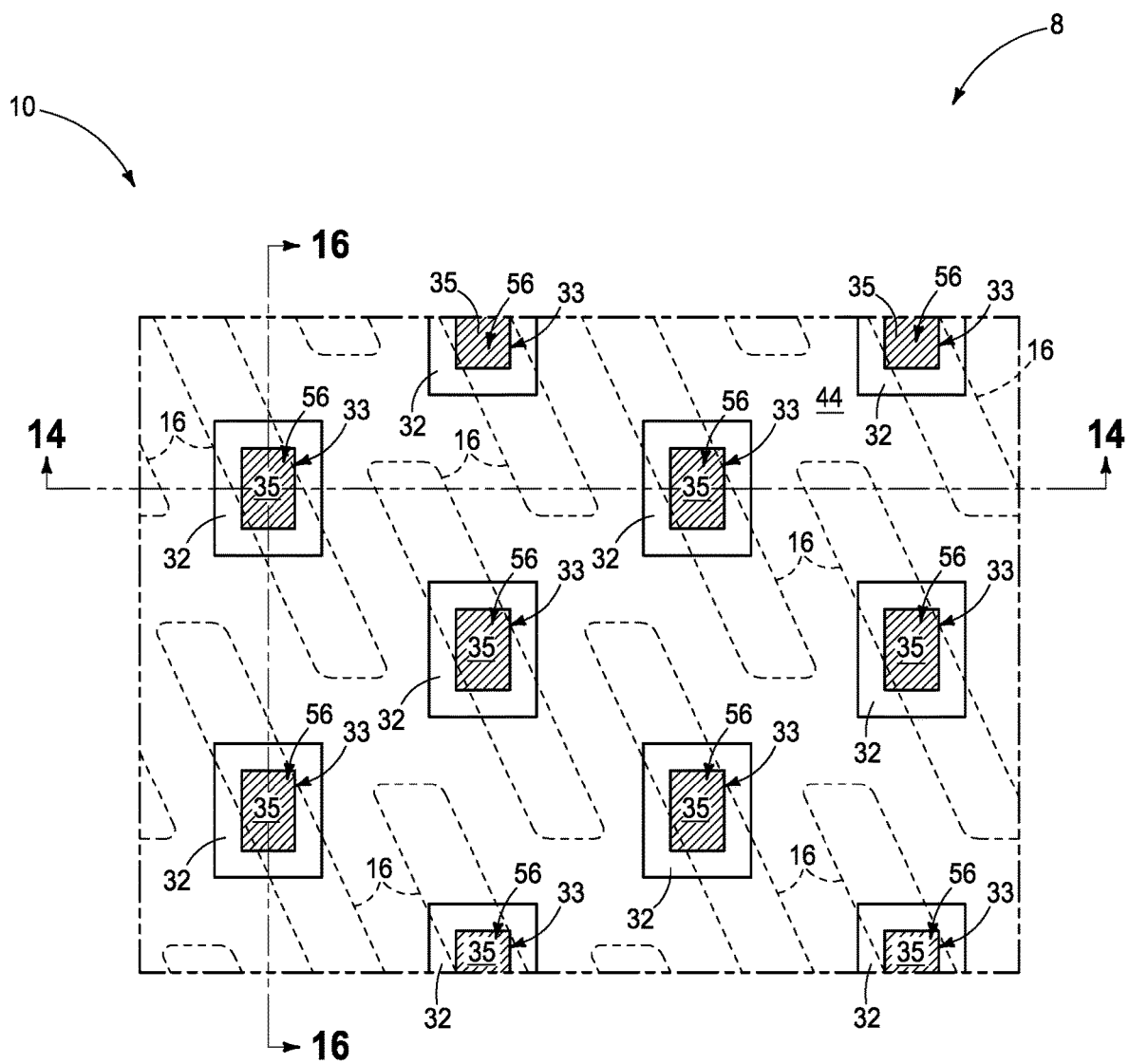
Figure 16:
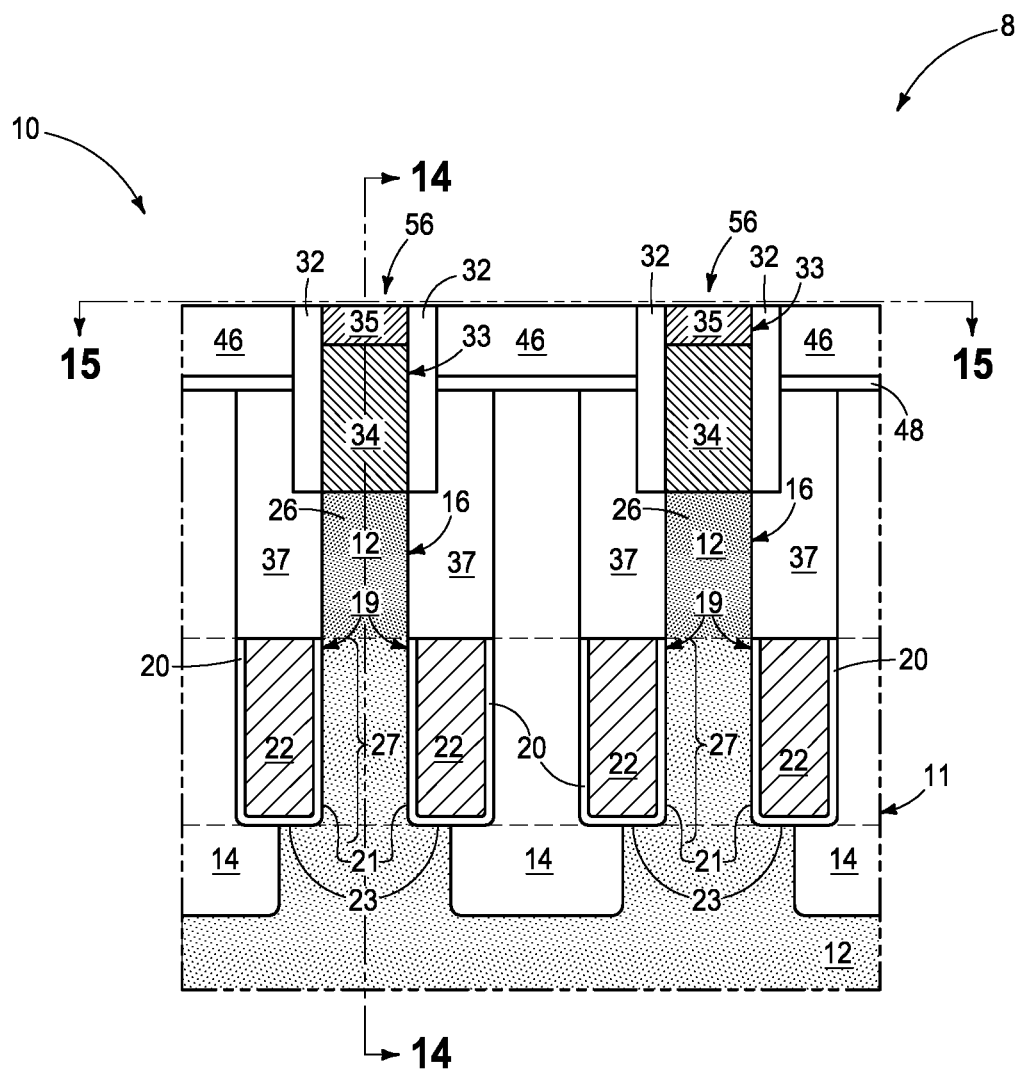

Referring to FIGS. 14-16, openings 56 have been lined with insulative material 32, followed by example anisotropic etching thereof to remove material 32 from being centrally over source/drain regions 26. Conductive material 34/35 has subsequently been formed and planarized back at least to the elevationally-outermost surfaces of materials 46 and 32. Such comprises but one example of forming conductive vias 33 that are individually directly electrically coupled to one of the source/drain regions (e.g., 26) of the pair of source/drain regions. Conductive vias 33 are spaced relative one another by intermediate material (e.g., one of more of materials 32, 37, 14, 48, and/or 46 when present) and comprise conductive material 34/35. In one such embodiment, the method sequentially comprises forming lower conductively-doped semiconductive material (e.g., 34) within openings 56 in the intermediate material. For example, such may be formed to completely fill remaining volume of openings 56 and then planarized back at least to elevationally outermost surfaces of materials 32 and 46. Conductively-doped semiconductive material 34 is then vertically recessed within openings 56 (e.g., by etching). Conductor material 35 is thereafter formed within openings 56 atop the vertically-recessed conductively-doped semiconductive material 34, for example to overfill remaining volume of openings 56 and then planarized back at least to elevationally outermost surfaces of materials 32 and 46.

Figure 17:
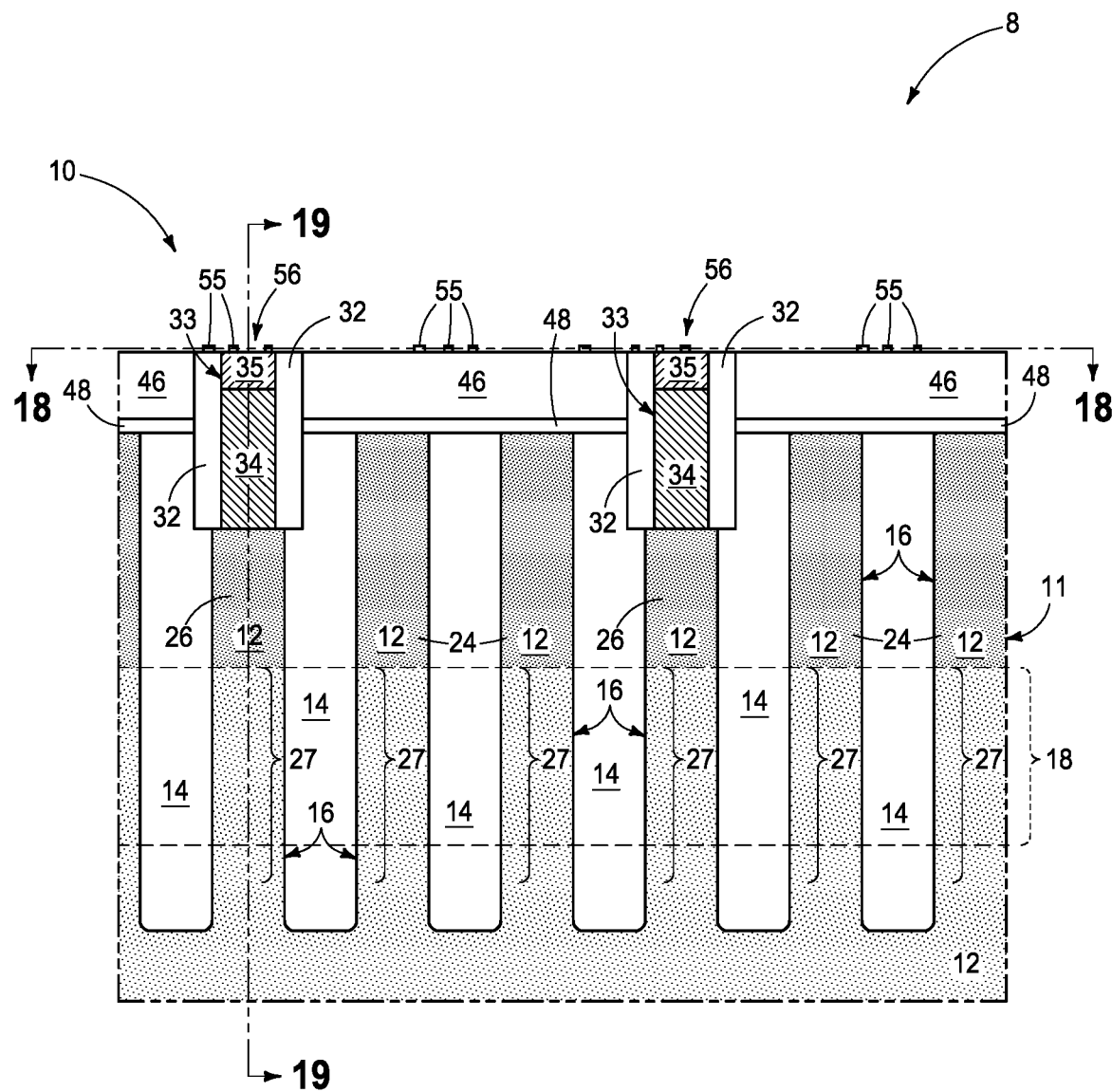
Figure 18:
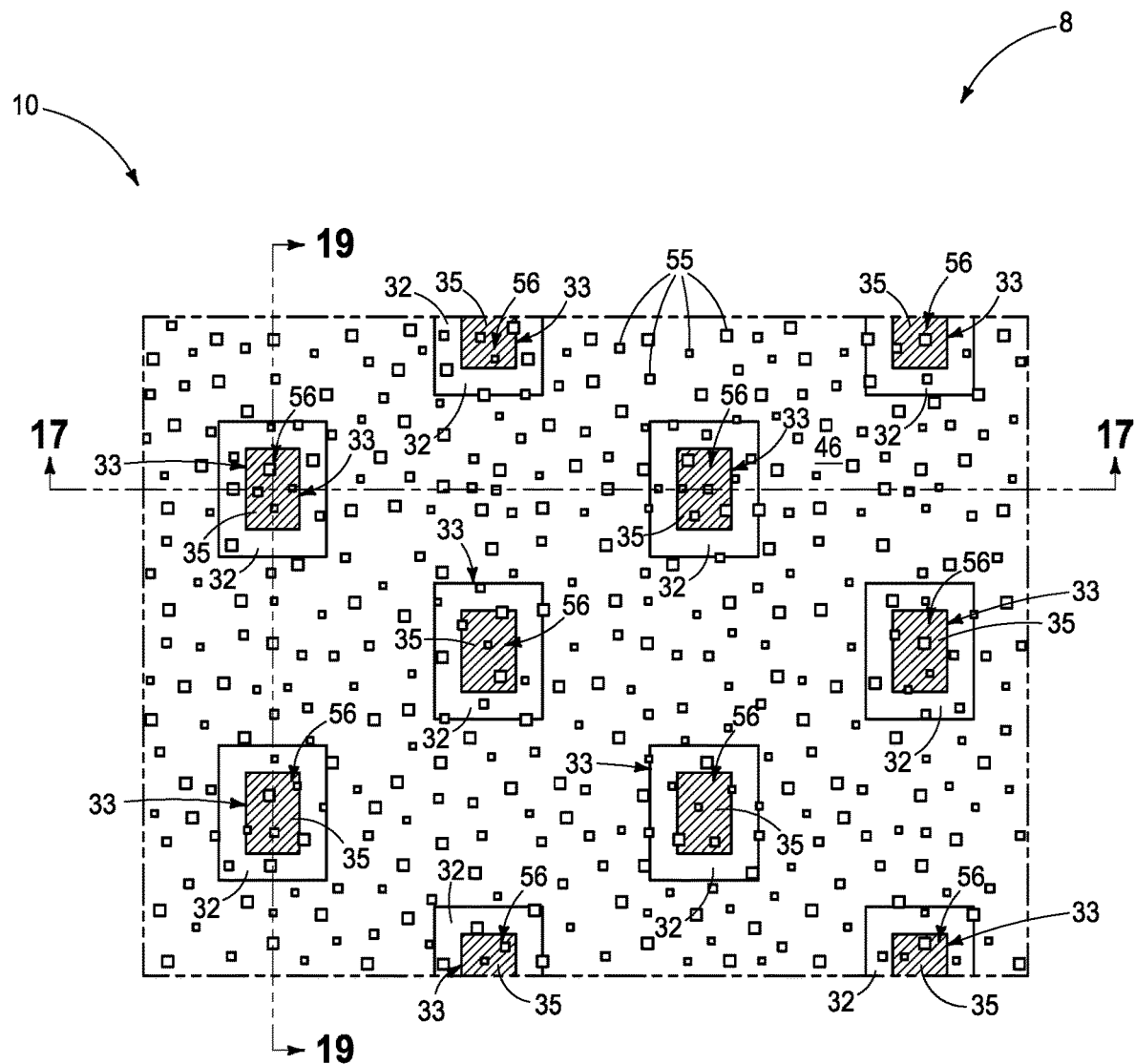
Figure 19:
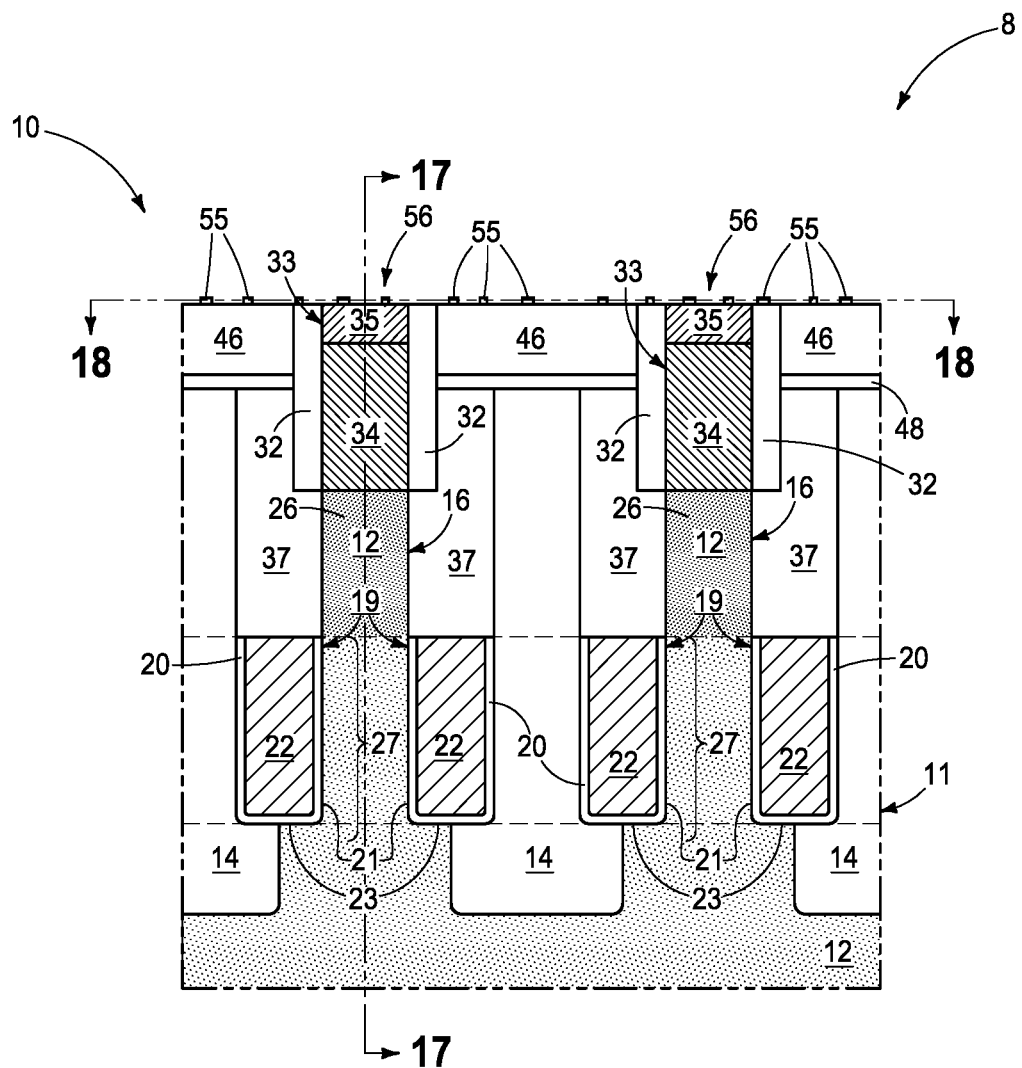

Referring to FIGS. 17-19, discontinuous material 55 has been formed atop conductive material 34/35 of conductive vias 33 and atop intermediate material 32 and 46 that is between conductive vias 33.

Figure 20:
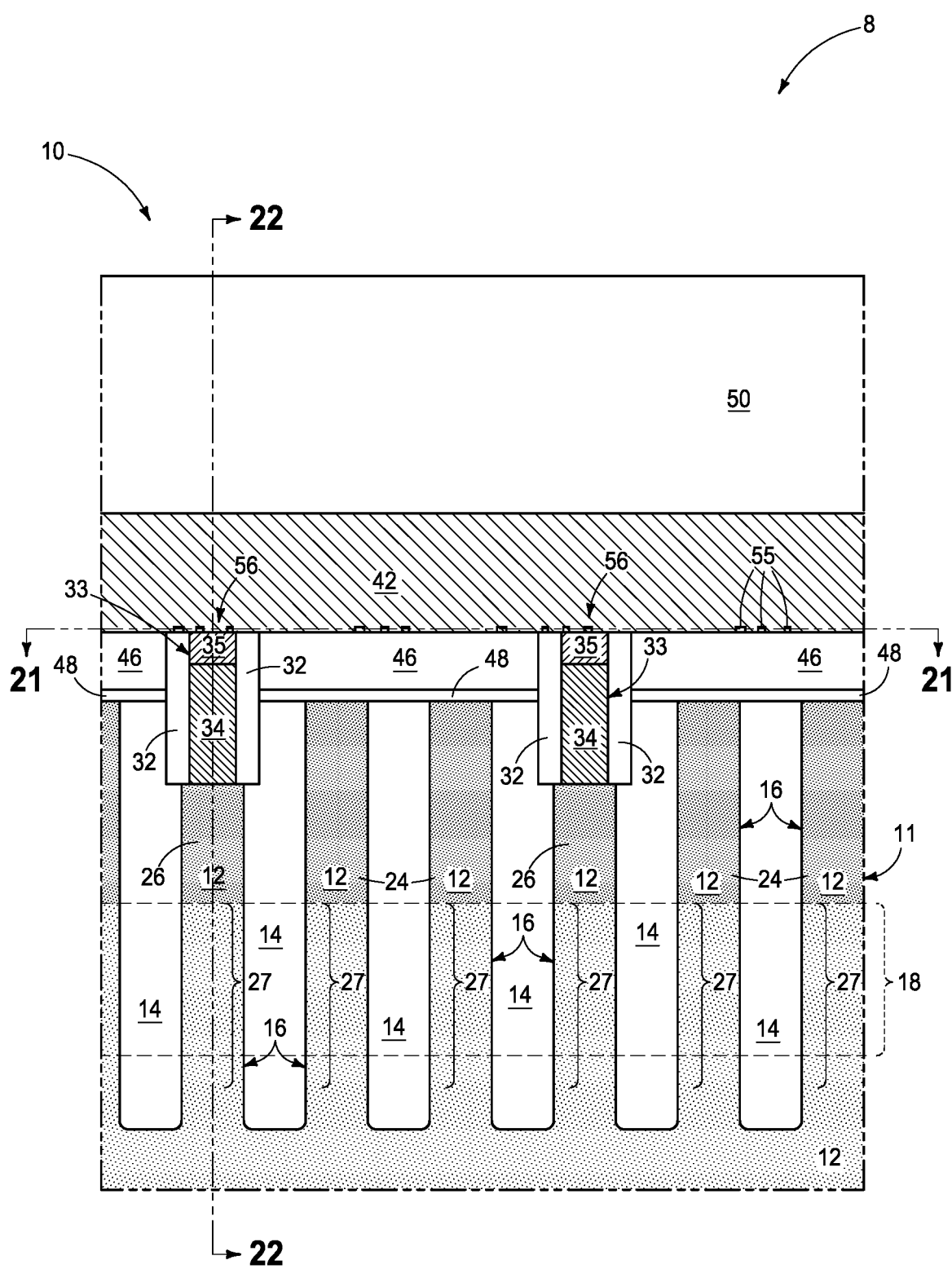
Figure 21:
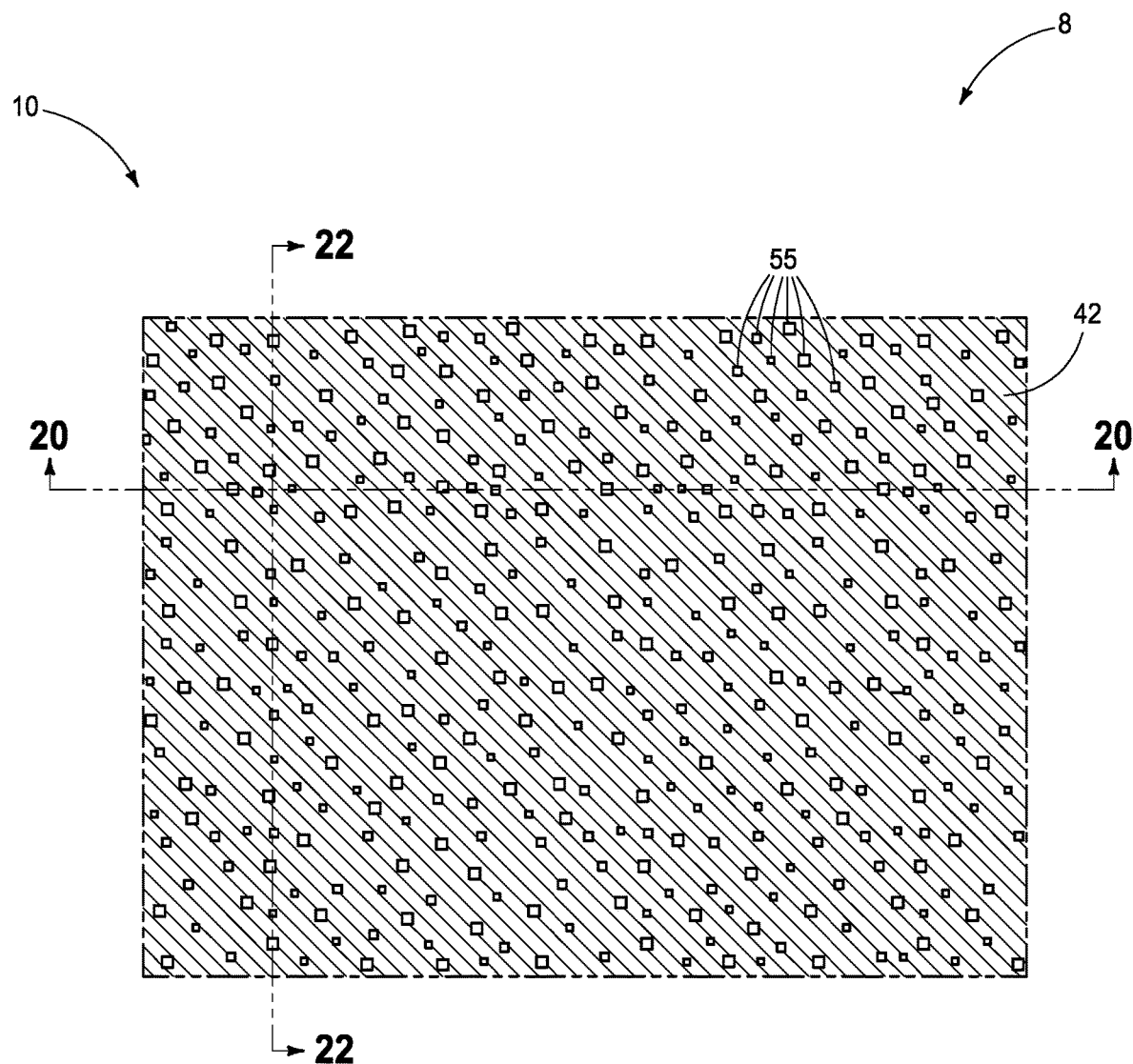
Figure 22:
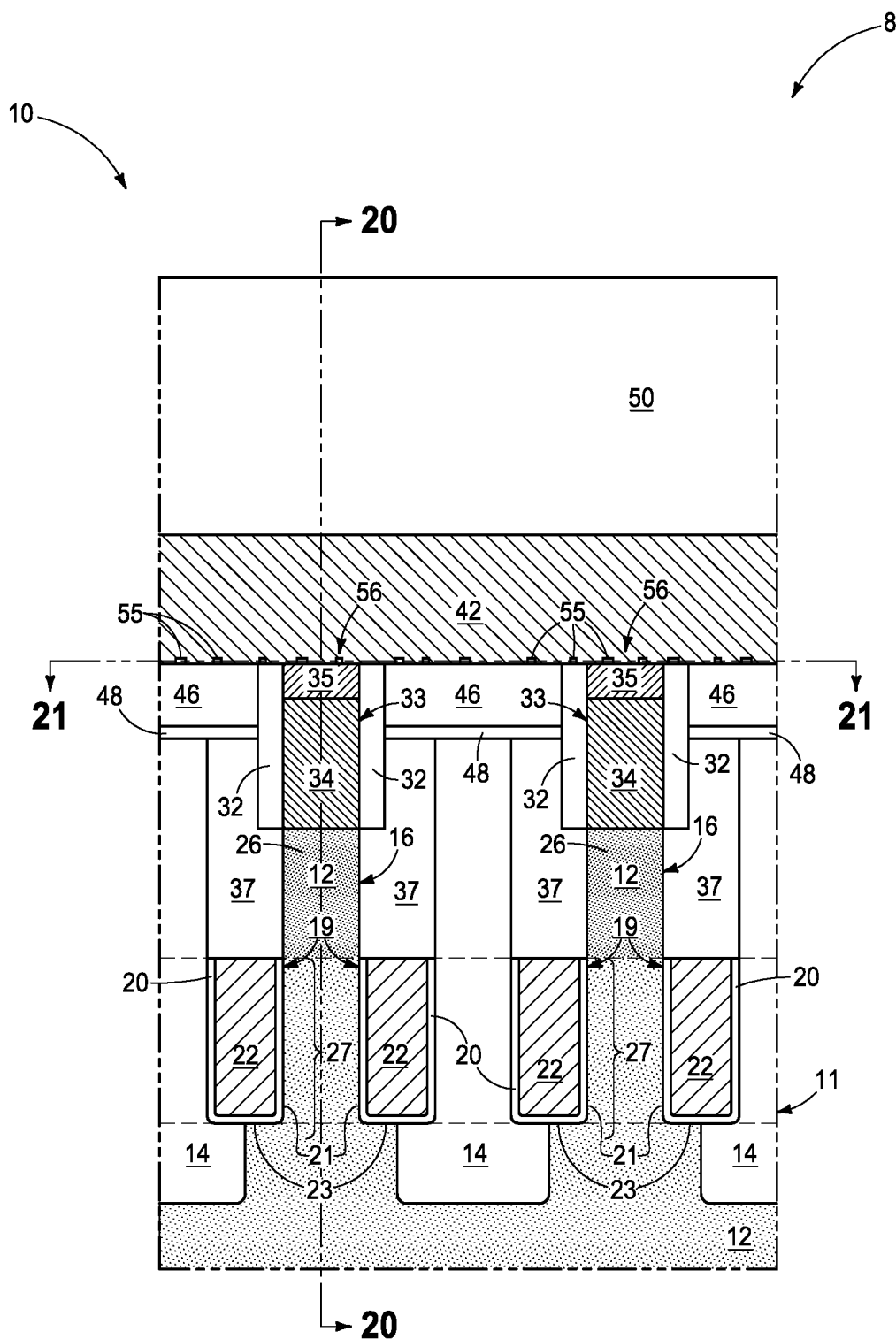

Referring to FIGS. 20-22, metal material 42 has been formed atop, directly against, and between discontinuous material 55 and atop and directly against conductive material 34/35 of conductive vias 33 and above intermediate material 32 and 46 that is between conductive vias 33. Discontinuous material 55 may function as a crystalline-growth seed material to facilitate growth of metal material 42 such that metal material 42 is formed in a desired crystalline orientation/phase. Example insulative material 50 has been formed there-atop.

Figure 23:
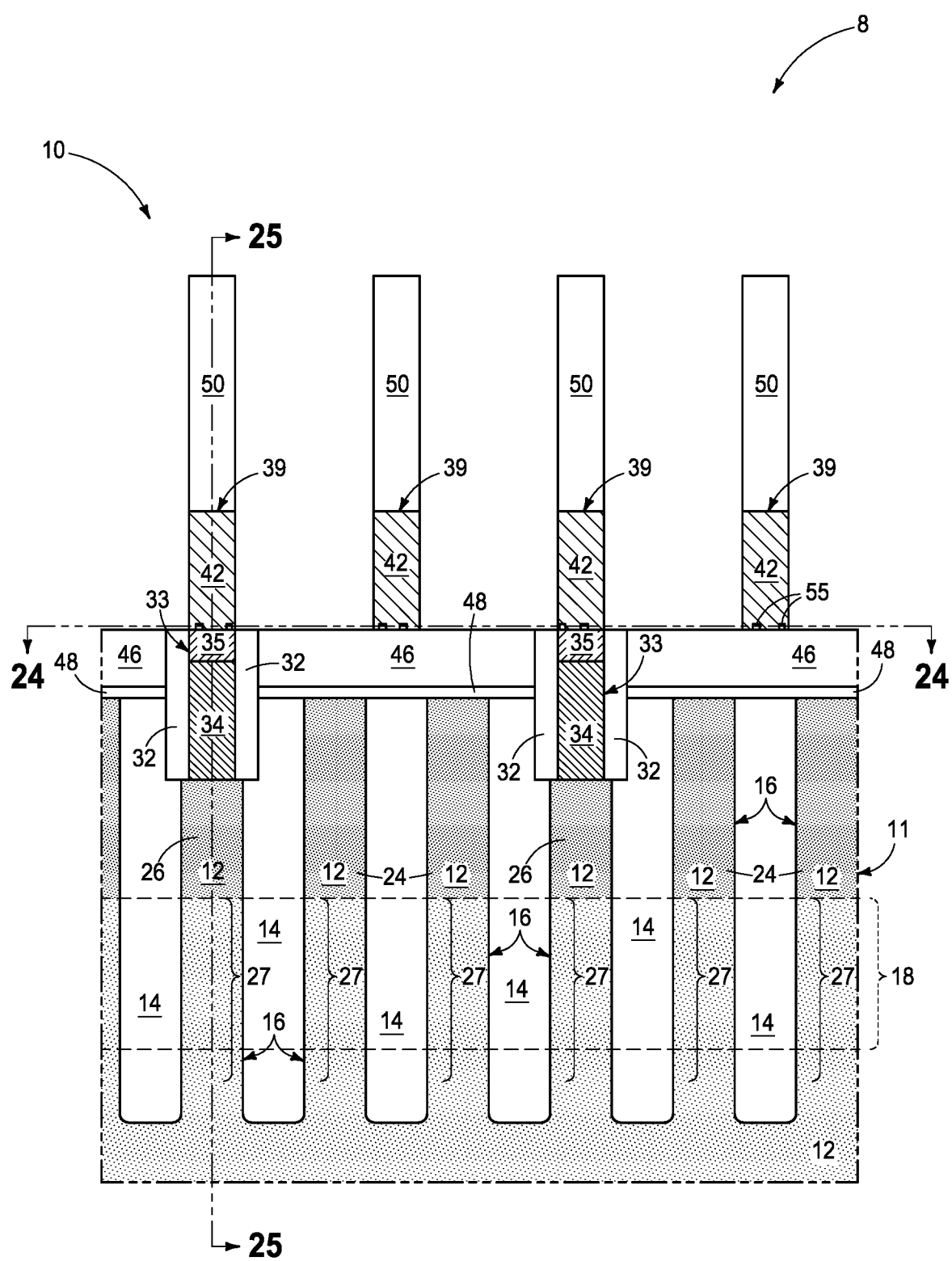
Figure 24:
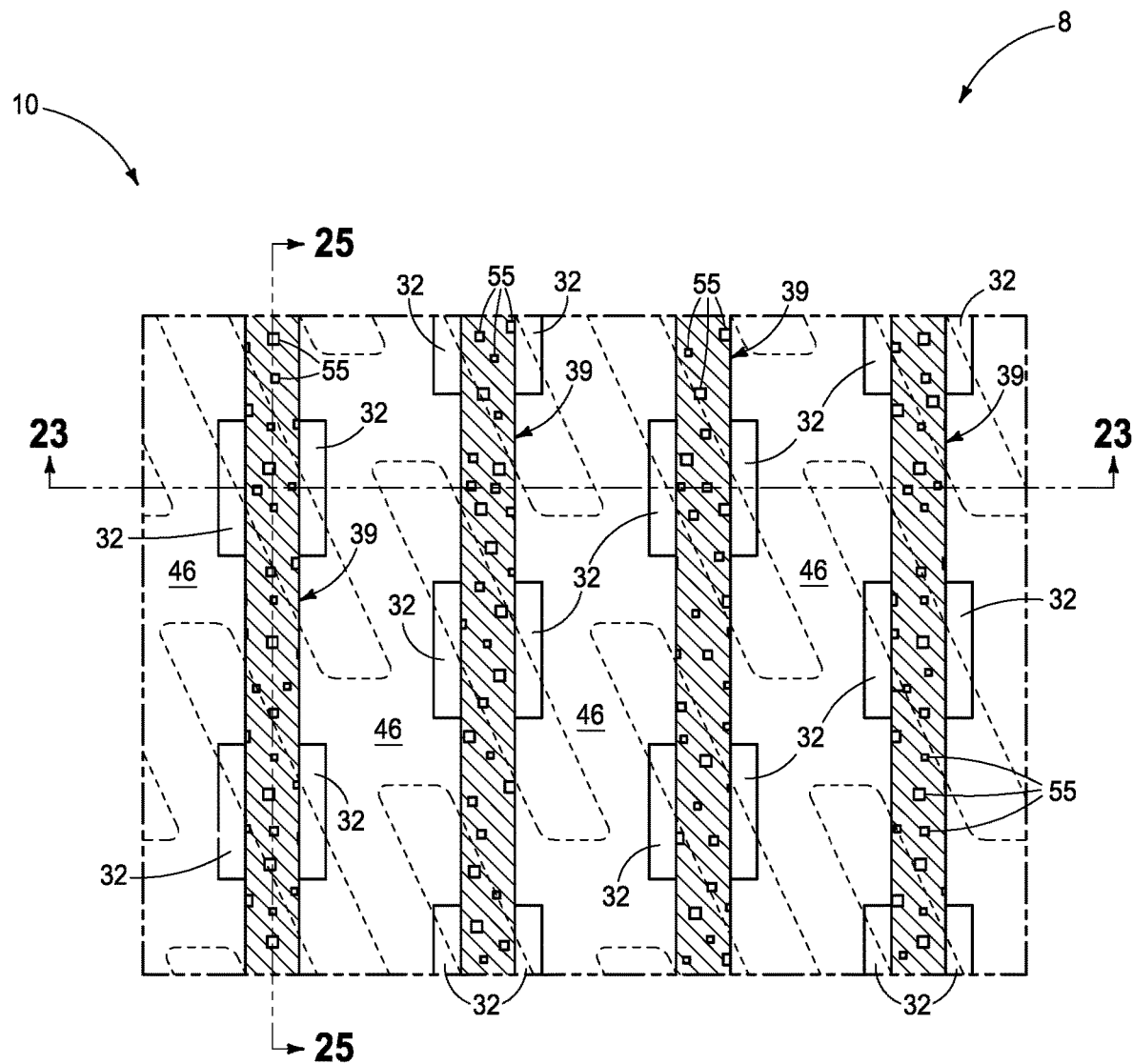
Figure 25:
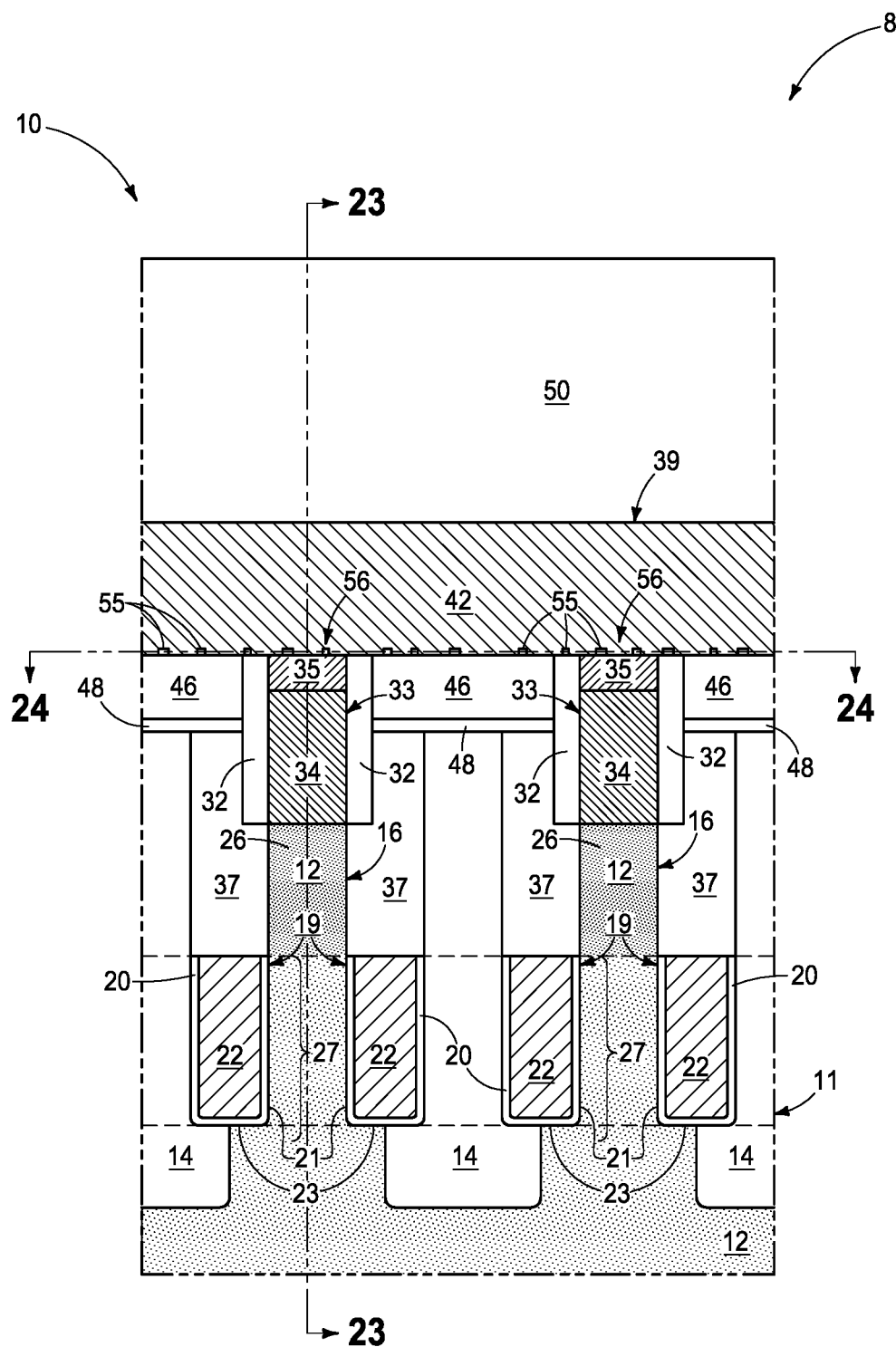

Referring to FIGS. 23-25, metal material 42 with discontinuous material 55 there-below has been formed (e.g., by subtractive etching) to comprise a digitline 39 that is atop intermediate material 32 and 46 that is between conductive vias 33 and is directly against individual conductive vias 33 of multiple transistors 25. For example, and in one embodiment, multiple digitlines 39 have been formed by subtractive patterning and etching, with in one example the etching removing discontinuous material 55 from being laterally between lines 39.

Figure 26:
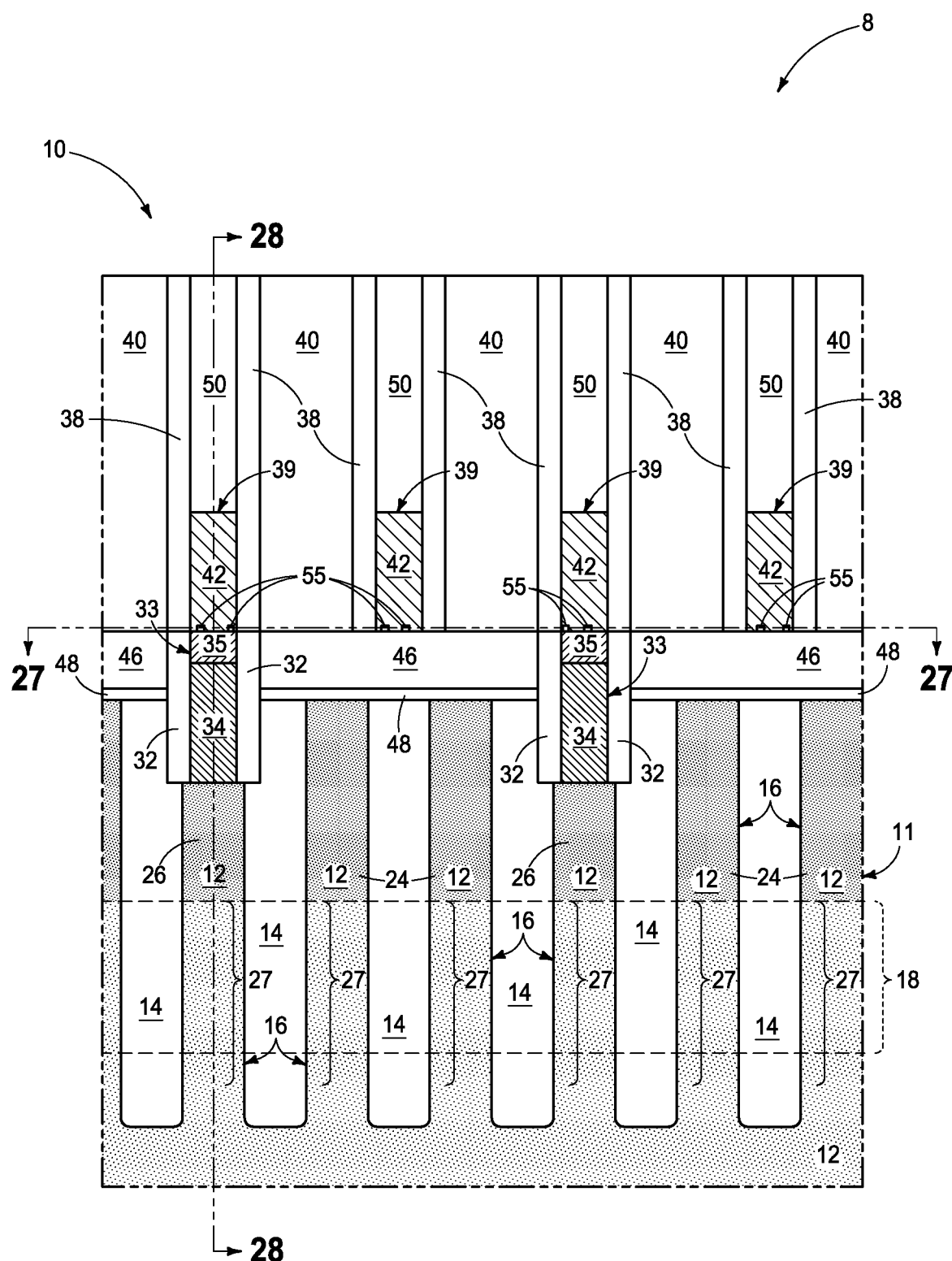
Figure 27:
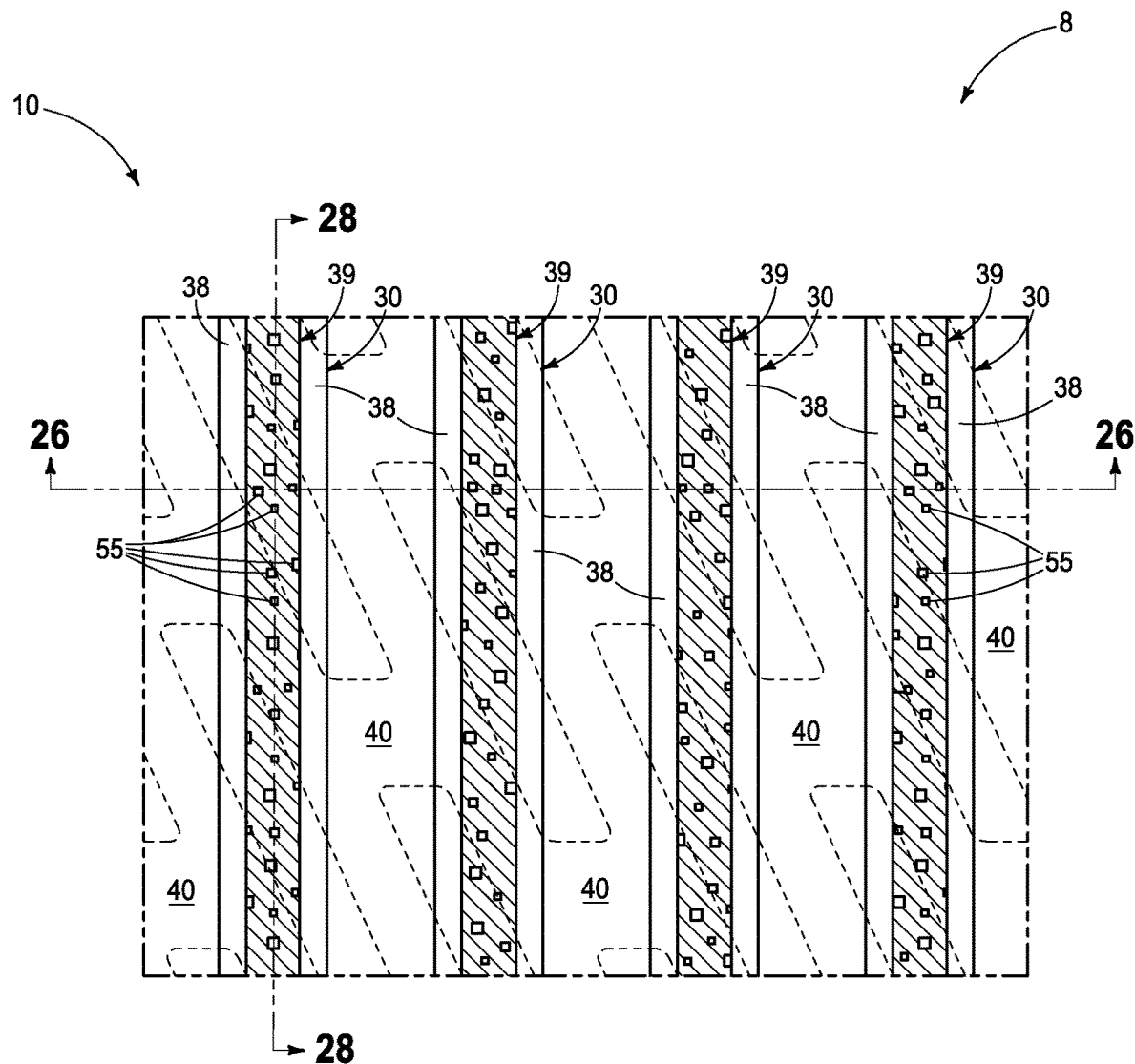
Figure 28:
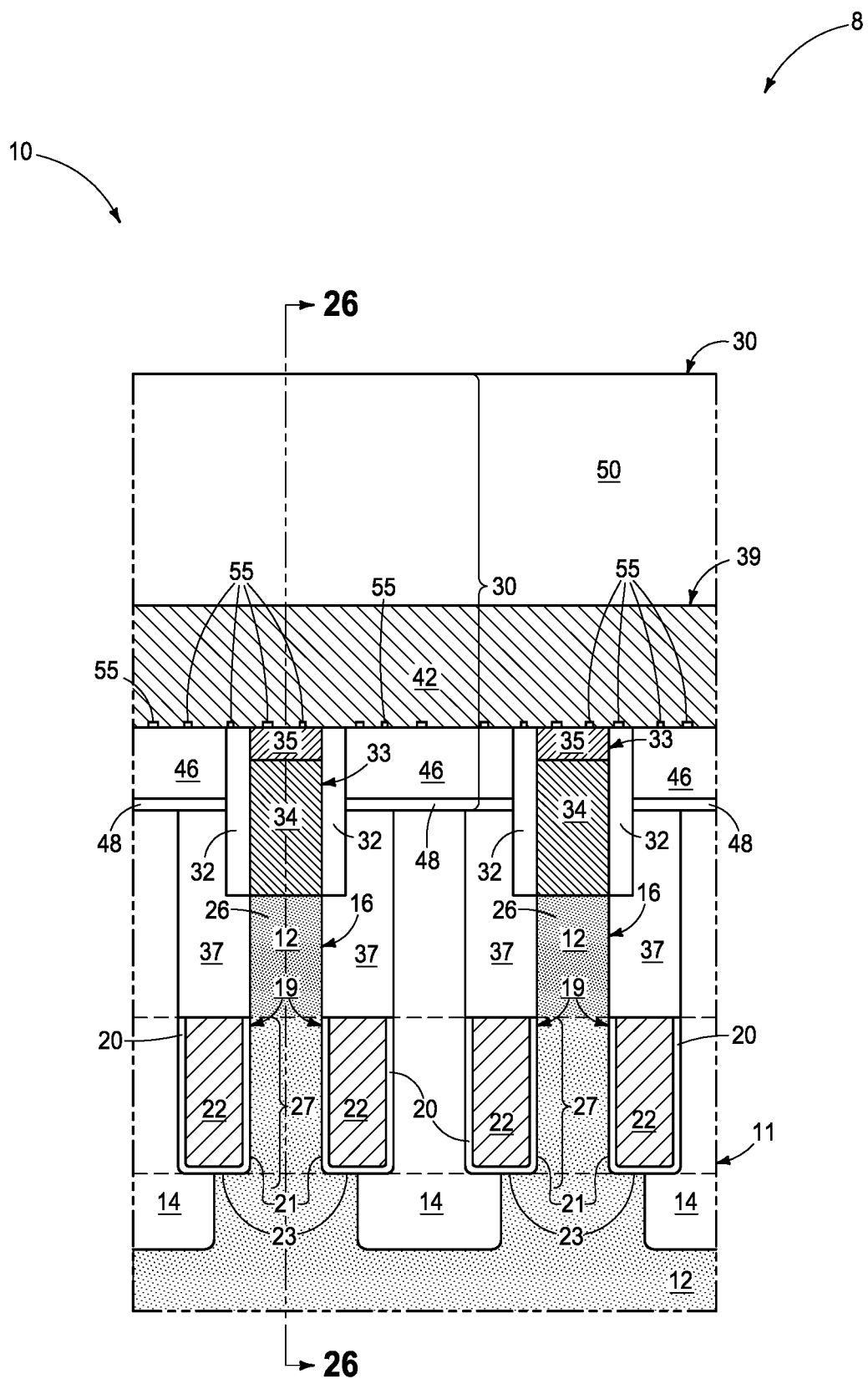
Figure 29:
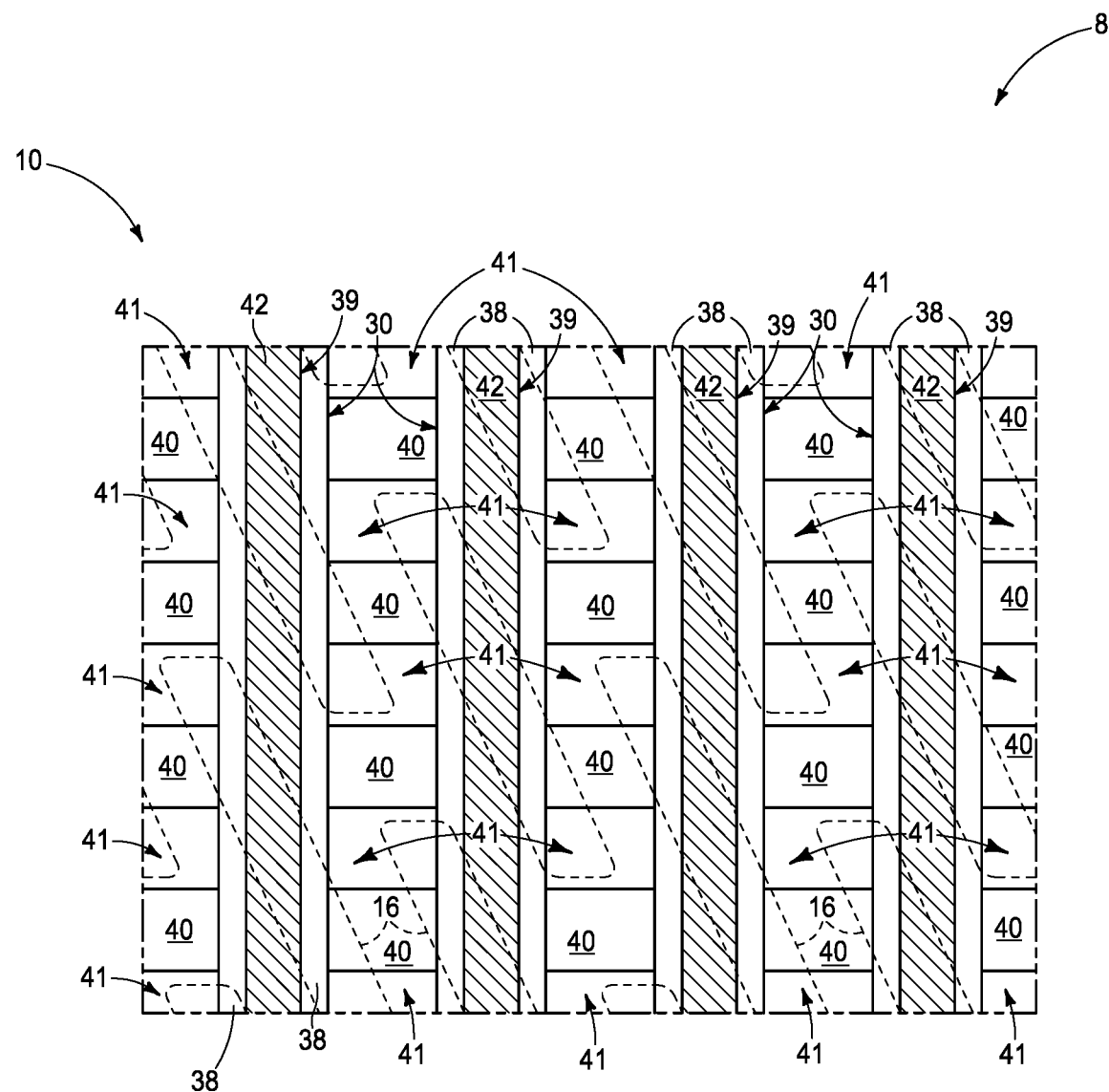

Referring to FIGS. 26-28, insulative spacers 38 have been formed resulting in formation of digitline structures 30 and dielectric material 40 has been deposited there-between. FIG. 29 shows forming of openings 41 there-through to source/drain regions 24. Subsequent processing would occur to produce the construction as shown in FIGS. 1-8. For example, conductor vias 36 would be formed in openings 41 to be individually directly electrically coupled to other source/drain regions 24 of the pairs of source drain regions. A storage element, such as a capacitor 85, would be formed to be directly electrically coupled to individual of conductor vias 36.

Any other attribute(s) or aspect(s) as shown and/or described herein with respect to other embodiments may be used.

The above-described example processing and depicted construction shows the forming of multiple digitlines 39 that are laterally spaced relative one another, with the discontinuous material not being laterally between such multiple digitlines 39. For example, FIGS. 23-25 show removal of discontinuous material 55 from between digitlines 39. Alternately, the discontinuous material may be laterally between the multiple digitlines, for example as shown and described relative to an alternate embodiment method and an alternate embodiment structure embodiment n FIGS. 30-32 with respect to a construction 8a. Like numerals from the above-described embodiments have been used where appropriate, with some construction differences being indicated with the suffix "a".

Figure 30:
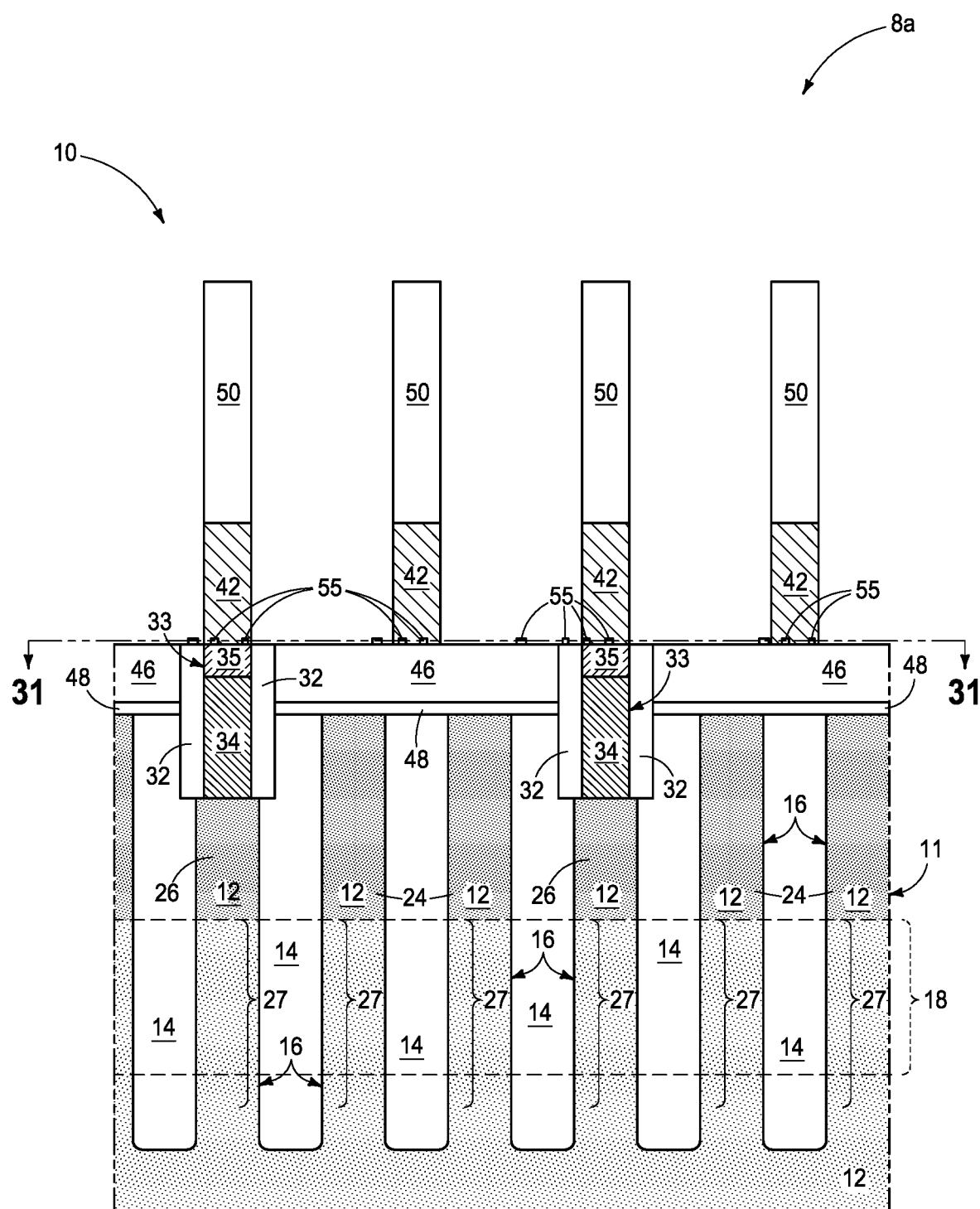
FIGS. 30-32 are diagrammatic sequential sectional views of alternate predecessor constructions to that shown by FIGS. 9-28 in process in accordance with some embodiments of the invention.
Figure 31:
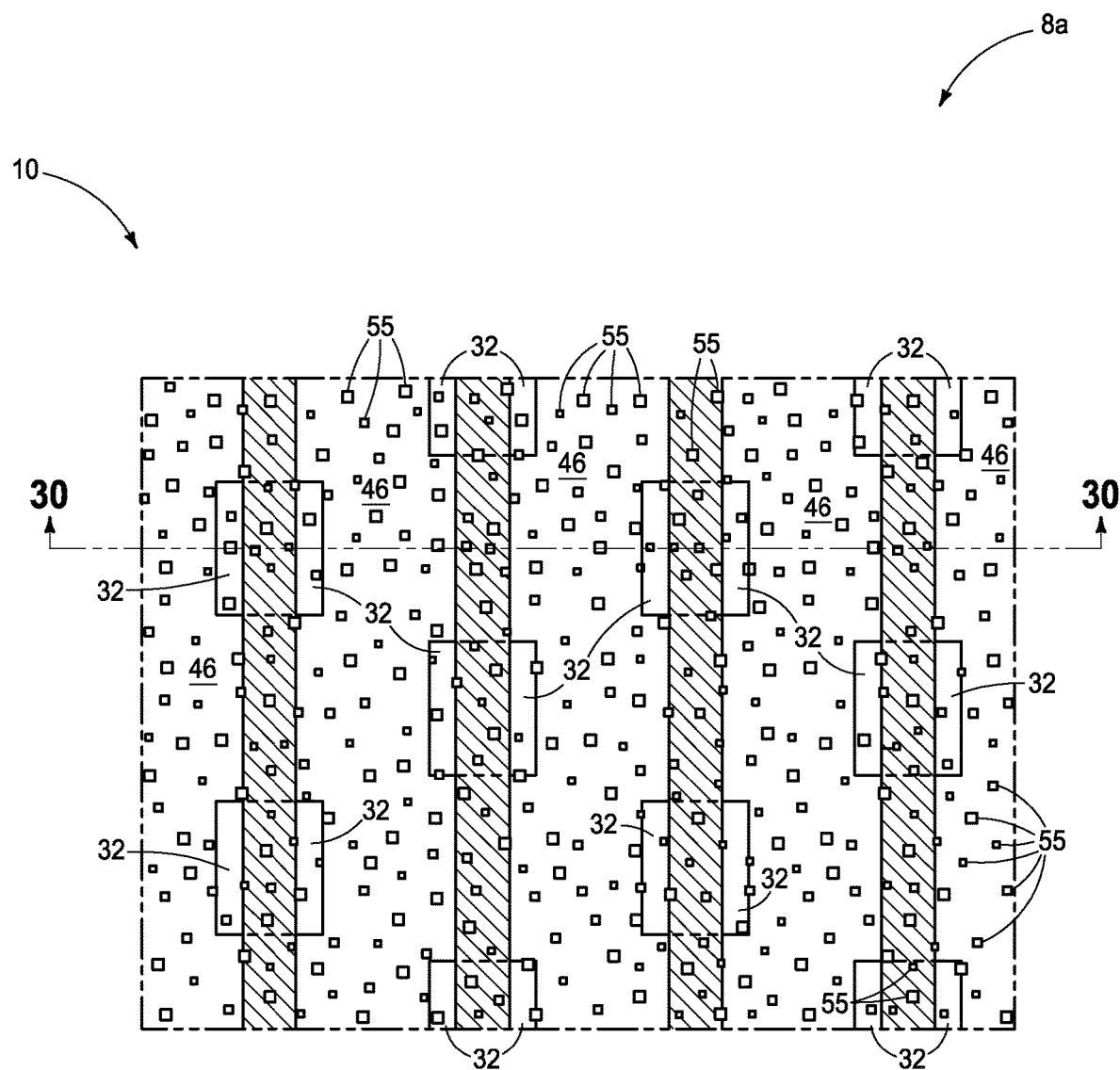
Figure 32:
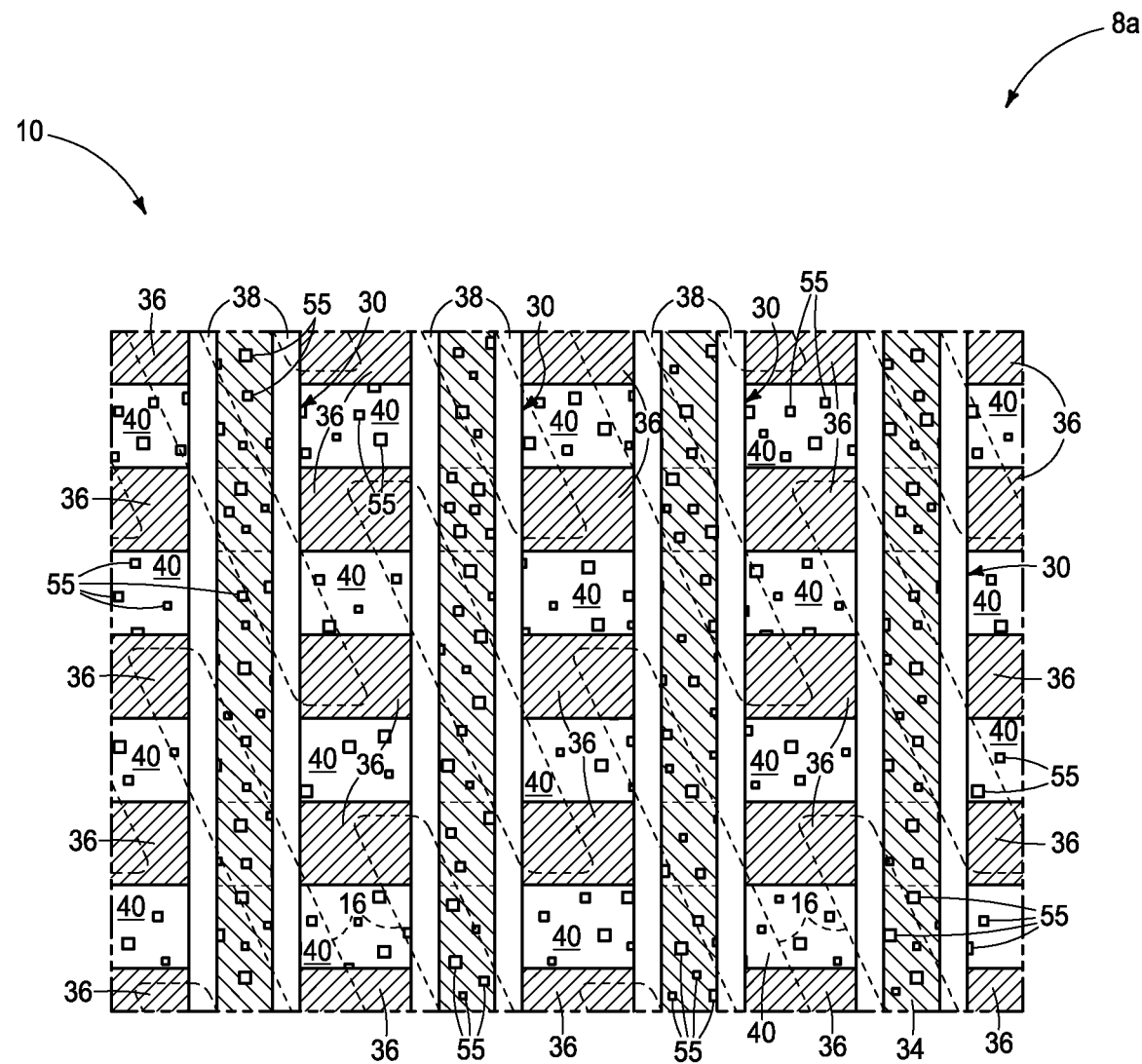

Referring to FIGS. 30 and 31, the patterning of metal material 42 to form digitlines 39 has left discontinuous material 55 laterally there-between. FIG. 32 shows subsequent processing whereby discontinuous material 55 so-remains horizontally outside of conductive/conductor vias 36. In one embodiment, discontinuous material 55 is not insulative (e.g., elemental silicon) and the method further comprises transforming (e.g., by anneal in an oxygen-containing ambient) discontinuous material 55 that is not insulative to be insulative laterally between said multiple conductive lines. For example, and by way of examples only, elemental silicon as material 55 could be annealed in an oxygen-containing ambient to form silicon dioxide material 55 or a conductive material 55 could be coated with a non-conductive material. Any other attribute(s) or aspect(s) as shown and/or described herein with respect to other embodiments may be used.

Embodiments of the invention encompass methods used in forming integrated circuitry independent of whether such circuitry is DRAM or other memory circuitry. Such a method comprises forming a plurality of conductive vias (e.g., 33) comprising conductive material (e.g., 34/35). The conductive vias are spaced relative one another by intermediate material (e.g., one of more of materials 32, 37, 14, 38, 48, and/or 46 when present). A discontinuous material (e.g., 55) is formed atop the conductive material of the vias and atop the intermediate material that is between the vias. Metal material (e.g., 42) is formed atop, directly against, and between the discontinuous material and atop and directly against the conductive material of the vias. The metal material is of different composition from that of the discontinuous material and is above the intermediate material that is between the vias. The metal material with discontinuous material there-below is formed to comprise a conductive line (e.g., 39) that is atop the intermediate material that is between the vias and is directly against individual of the vias. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees)

along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming integrated circuitry comprises forming a plurality of conductive vias comprising conductive material. The conductive vias are spaced relative one another by intermediate material. A discontinuous material is formed atop the conductive material of the vias and atop the intermediate material that is between the vias. Metal material is formed atop, directly against, and between the discontinuous material and atop and directly against the conductive material of the vias. The metal material is of different composition from that of the discontinuous material and is above the intermediate material that is between the vias. The metal material with discontinuous material there-below is formed to comprise a conductive line that is atop the intermediate material that is between the vias and is directly against individual of the vias.

In some embodiments, a method used in forming DRAM circuitry comprises forming transistors individually comprising a pair of source/drain regions, a channel region between the pair of source/drain regions, a conductive gate operatively proximate the channel region; and a gate insulator between the conductive gate and the channel region. Conductive vias are formed that individually directly electrically couple to one of the source/drain regions of the pairs. The conductive vias are spaced relative one another by intermediate material and comprise conductive material. A discontinuous material is formed atop the conductive material of the conductive vias and atop the intermediate material that is between the conductive vias. Metal material is formed atop, directly against, and between the discontinuous material and atop and directly against the conductive material of the conductive vias. The metal material is of different composition from that of the discontinuous material and is above the intermediate material that is between the conductive vias. The metal material is formed with discontinuous material there-below to comprise a digitline that is atop the intermediate material that is between the conductive vias and is directly against individual of the conductive vias of multiple of the transistors. Conductor vias are formed that individually directly electrically couple to the other source/drain regions of the pairs. A storage element is formed directly electrically coupled to individual of the conductor vias.

In some embodiments, integrated circuitry comprises a plurality of conductive vias comprising conductive material. The conductive vias are spaced relative one another by intermediate material. A conductive line is atop the intermediate material that is between the vias and directly electrically couples to individual of the vias. The conductive line comprises metal material directly against the conductive material of the vias. A discontinuous material is vertically between the conductive line and the conductive material of the vias and is vertically between the conductive line and the intermediate material that is between the vias. The discontinuous material is of different composition from that of the metal material.

In some embodiments, DRAM circuitry comprises transistors individually comprising a pair of source/drain regions, a channel region between the pair of source/drain regions, a conductive gate operatively proximate the channel region, and a gate insulator between the conductive gate and the channel region. First conductive vias individually directly electrically couple to one of the source/drain regions of the pairs. A storage element directly electrically couples to individual of the first conductive vias, and second conductive vias individually directly electrically couple to the other of the source/drain regions of the pairs. The second conductive vias are spaced relative one another by intermediate material and comprise conductive material. A digitline is atop the intermediate material that is between the second vias and directly electrically couple to individual of the second vias of multiple of the transistors. The digitline comprises metal material directly against the conductive material of the second vias. A discontinuous material is vertically between the digitline and the conductive material of the second vias and is vertically between the digitline and the intermediate material that is between the second vias. The discontinuous material is of different composition from that of the metal material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming integrated circuitry, comprising:
    forming a plurality of conductive vias comprising conductive material, the conductive vias being spaced relative one another by intermediate material;
    forming a discontinuous material atop the conductive material of the vias and atop the intermediate material that is between the vias, the discontinuous material being discontinuous between its laterally-outermost edges in a vertical cross-section;
    forming metal material atop, directly against, and between the discontinuous material in the vertical cross-section and atop and directly against the conductive material of the vias in the vertical cross-section, the metal material being of different composition from that of the discontinuous material and being above the intermediate material that is between the vias; and
    forming the metal material with discontinuous material there-below to comprise a conductive line that is atop the intermediate material that is between the vias and is directly against individual of the vias.

2. The method of claim 1 wherein the discontinuous material is insulative.

3. The method of claim 1 wherein the discontinuous material is conductive.

4. The method of claim 1 comprising forming multiple of said conductive lines that are laterally spaced relative one another, the discontinuous material being laterally between said multiple conductive lines.

5. The method of claim 4 wherein the discontinuous material is not insulative and further comprising transforming the discontinuous material that is not insulative to be insulative laterally between said multiple conductive lines.

6. The method of claim 4 wherein said multiple conductive lines are formed by subtractive patterning and etching, the etching removing the discontinuous material from being laterally between said multiple conductive lines.

7. The method of claim 1 comprising forming multiple of said conductive lines that are laterally spaced relative one another, the discontinuous material not being laterally between said multiple conductive lines.

8. The method of claim 1 wherein an uppermost portion of the intermediate material comprises insulative material.

9. A method used in forming integrated circuitry, comprising:
    forming a plurality of conductive vias comprising conductive material, the conductive vias being spaced relative one another by intermediate material;
    forming a discontinuous material atop the conductive material of the vias and atop the intermediate material that is between the vias;
    forming metal material atop, directly against, and between the discontinuous material and atop and directly against the conductive material of the vias, the metal material being of different composition from that of the discontinuous material and being above the intermediate material that is between the vias;
    forming the metal material with discontinuous material there-below to comprise a conductive line that is atop the intermediate material that is between the vias and is directly against individual of the vias; and
    forming the conductive material of the vias to comprise lower conductively-doped semiconductive material below upper conductor material, the upper conductor material being of different composition from that of the lower conductively-doped semiconductive material.

10. The method of claim 9 sequentially comprising:
forming the lower conductively-doped semiconductive material within openings in the intermediate material;
vertically recessing the conductively-doped semiconductive material within openings; and
forming the conductor material within the openings atop the vertically-recessed conductively-doped semiconductive material.

11. A method used in forming integrated circuitry, comprising:
forming a plurality of conductive vias comprising conductive material, the conductive vias being spaced relative one another by intermediate material;
forming a discontinuous material atop the conductive material of the vias and atop the intermediate material that is between the vias;
forming metal material atop, directly against, and between the discontinuous material and atop and directly against the conductive material of the vias, the metal material being of different composition from that of the discontinuous material and being above the intermediate material that is between the vias;
forming the metal material with discontinuous material there-below to comprise a conductive line that is atop the intermediate material that is between the vias and is directly against individual of the vias; and
the discontinuous material comprises elemental-form silicon.

12. A method used in forming integrated circuitry, comprising:
forming a plurality of conductive vias comprising conductive material, the conductive vias being spaced relative one another by intermediate material;
forming a discontinuous material atop the conductive material of the vias and atop the intermediate material that is between the vias;
forming metal material atop, directly against, and between the discontinuous material and atop and directly against the conductive material of the vias, the metal material being of different composition from that of the discontinuous material and being above the intermediate material that is between the vias;
forming the metal material with discontinuous material there-below to comprise a conductive line that is atop the intermediate material that is between the vias and is directly against individual of the vias; and
the discontinuous material comprises void space there-through, the void space having greater total horizontal area than total horizontal area of the material of the discontinuous material.

13. A method used in forming integrated circuitry, comprising:
forming a plurality of conductive vias comprising conductive material, the conductive vias being spaced relative one another by intermediate material;
forming a discontinuous material atop the conductive material of the vias and atop the intermediate material that is between the vias;
forming metal material atop, directly against, and between the discontinuous material and atop and directly against the conductive material of the vias, the metal material being of different composition from that of the discontinuous material and being above the intermediate material that is between the vias;
forming the metal material with discontinuous material there-below to comprise a conductive line that is atop the intermediate material that is between the vias and is directly against individual of the vias; and
an uppermost portion of the intermediate material comprises conductive material.

14. The method of claim 13 wherein the conductive material comprises conductively-doped semiconductive material.

15. A method used in forming integrated circuitry, comprising:
forming a plurality of conductive vias comprising conductive material, the conductive vias being spaced relative one another by intermediate material;
forming a discontinuous material atop the conductive material of the vias and atop the intermediate material that is between the vias;
forming metal material atop, directly against, and between the discontinuous material and atop and directly against the conductive material of the vias, the metal material being of different composition from that of the discontinuous material and being above the intermediate material that is between the vias;
forming the metal material with discontinuous material there-below to comprise a conductive line that is atop the intermediate material that is between the vias and is directly against individual of the vias; and
an uppermost portion of the intermediate material comprises semiconductive material.

16. A method used in forming integrated circuitry, comprising:
forming a plurality of conductive vias comprising conductive material, the conductive vias being spaced relative one another by intermediate material;
forming a discontinuous material atop the conductive material of the vias and atop the intermediate material that is between the vias;
forming metal material atop, directly against, and between the discontinuous material and atop and directly against the conductive material of the vias, the metal material being of different composition from that of the discontinuous material and being above the intermediate material that is between the vias;
forming the metal material with discontinuous material there-below to comprise a conductive line that is atop the intermediate material that is between the vias and is directly against individual of the vias; and
an uppermost portion of the intermediate material comprises insulative material and conductive material.

17. A method used in forming DRAM circuitry, comprising:
forming transistors individually comprising:
a pair of source/drain regions;
a channel region between the pair of source/drain regions;
a conductive gate operatively proximate the channel region; and
a gate insulator between the conductive gate and the channel region;
forming conductive vias that are individually directly electrically coupled to one of the source/drain regions of the pairs, the conductive vias being spaced relative one another by intermediate material and comprising conductive material;
forming a discontinuous material atop the conductive material of the conductive vias and atop the intermediate material that is between the conductive vias, the discontinuous material being discontinuous between its laterally-outermost edges in a vertical cross-section;

forming metal material atop, directly against, and between the discontinuous material in the vertical cross-section and atop and directly against the conductive material of the conductive vias in the vertical cross-section, the metal material being of different composition from that of the discontinuous material and being above the intermediate material that is between the conductive vias;

forming the metal material with discontinuous material there-below to comprise a digitline that is atop the intermediate material that is between the conductive vias and is directly against individual of the conductive vias of multiple of the transistors;

forming conductor vias that are individually directly electrically coupled to the other source/drain regions of the pairs; and forming a storage element directly electrically coupled to individual of the conductor vias.

18. Integrated circuitry comprising:

a plurality of conductive vias comprising conductive material, the conductive vias being spaced relative one another by intermediate material;

a conductive line atop the intermediate material that is between the vias and directly electrically coupled to individual of the vias, the conductive line comprising metal material directly against the conductive material of the vias; and a discontinuous material vertically between the conductive line and the conductive material of the vias and vertically between the conductive line and the intermediate material that is between the vias, the discontinuous material being of different composition from that of the metal material, the discontinuous material being discontinuous between its laterally-outermost edges in a vertical cross-section.

19. The integrated circuitry of claim 18 wherein the conductive material of the vias comprises lower conductively-doped semiconductive material below upper conductor material, the upper conductor material being of different composition from that of the lower conductively-doped semiconductive material.

20. The integrated circuitry of claim 19 wherein the conductively-doped semiconductive material comprises conductively-doped polysilicon.

21. The integrated circuitry of claim 18 wherein the conductive material comprises a metal nitride.

22. The integrated circuitry of claim 18 wherein the conductive material comprises a metal carbo-nitride.

23. The integrated circuitry of claim 18 wherein the conductive material comprises an elemental-form metal.

24. The integrated circuitry of claim 18 wherein the metal material comprises at least one of elemental-form Ru and elemental-form Mo.

25. The integrated circuitry of claim 18 wherein the discontinuous material comprises void space there-through, the void space having greater total horizontal area than total horizontal area of the material of the discontinuous material.

26. The integrated circuitry of claim 18 wherein the discontinuous material is insulative.

27. The integrated circuitry of claim 18 wherein the discontinuous material is conductive.

28. The integrated circuitry of claim 27 wherein the discontinuous material is of the same composition as that of the conductive material.

29. The integrated circuitry of claim 27 wherein the discontinuous material comprises an elemental-form metal.

30. The integrated circuitry of claim 18 wherein the discontinuous material is of different composition from that of the conductive material.

31. The integrated circuitry of claim 18 wherein the discontinuous material comprises elemental-form silicon.

32. The integrated circuitry of claim 18 comprising multiple of said conductive lines that are laterally spaced relative one another, the discontinuous material not being laterally between said multiple conductive lines.

33. The integrated circuitry of claim 18 comprising multiple of said conductive lines that are laterally spaced relative one another, the discontinuous material being laterally between said multiple conductive lines.

34. The integrated circuitry of claim 18 comprising NAND, the conductive line being a digitline.

35. DRAM circuitry, comprising:

transistors individually comprising:
  a pair of source/drain regions;
  a channel region between the pair of source/drain regions;
  a conductive gate operatively proximate the channel region; and
  a gate insulator between the conductive gate and the channel region;

first conductive vias that are individually directly electrically coupled to one of the source/drain regions of the pairs;

a storage element directly electrically coupled to individual of the first conductive vias;

second conductive vias that are individually directly electrically coupled to the other of the source/drain regions of the pairs, the second conductive vias being spaced relative one another by intermediate material and comprising conductive material;

a digitline atop the intermediate material that is between the second vias and directly electrically coupled to individual of the second vias of multiple of the transistors, the digitline comprising metal material directly against the conductive material of the second vias; and a discontinuous material vertically between the digitline and the conductive material of the second vias and vertically between the digitline and the intermediate material that is between the second vias, the discontinuous material being of different composition from that of the metal material, the discontinuous material being discontinuous between its laterally-outermost edges in a vertical cross-section.

36. The DRAM circuitry of claim 35 wherein the transistors are in pairs, one of the source/drain regions of the pair of source/drain regions in individual of the pairs of transistors being between the conductive gates in and being shared by the individual pairs of transistors, the others of the source/drain regions of the pair of source/drain regions not being shared in the individual pairs of transistors.

37. The DRAM circuitry of claim 36 wherein the pairs of transistors comprise pairs of recessed access devices individually comprising:

the conductive gate being in a trench in semiconductive material;

the gate insulator being along sidewalls and a base of the trench between the conductive gate and the semiconductive material;

the pair of source/drain regions being in upper portions of the semiconductive material on opposing sides of the trench; and the channel region being in the semiconductive material below the pair of source/drain regions along the trench sidewalls and around the trench base.

\* \* \* \* \*